(12) United States Patent
Tang et al.

(10) Patent No.: US 7,821,045 B2
(45) Date of Patent: Oct. 26, 2010

(54) APPARATUS, SYSTEM, AND METHOD FOR MULTIPLE-SEGMENT FLOATING GATE

(75) Inventors: Qiang Tang, Fremont, CA (US); Venkat Narayanan, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 740 days.

(21) Appl. No.: 11/617,484

(22) Filed: Dec. 28, 2006

(65) Prior Publication Data

US 2008/0157161 A1      Jul. 3, 2008

(51) Int. Cl.
*H01L 29/80* (2006.01)
*H01L 21/8238* (2006.01)

(52) U.S. Cl. .................. 257/261; 257/314; 257/315; 257/E21.179; 257/E21.68; 257/E29.3; 438/201; 438/211; 438/257

(58) Field of Classification Search .................. 257/261, 257/314, 315, E21.179, E21.68, E21.681, 257/E29.3; 438/201, 211, 257, 593
See application file for complete search history.

(56) References Cited

U.S. PATENT DOCUMENTS 7,489,010 B2 *   2/2009   Takeuchi ..................... 257/401
7,494,860 B2 *   2/2009   Mokhlesi ..................... 438/201

* cited by examiner

*Primary Examiner*—Hsien-ming Lee
(74) *Attorney, Agent, or Firm*—Schwegman, Lundberg & Woessner, P.A.

(57) ABSTRACT

Various embodiments include a substrate and a memory cell coupled to the substrate. The memory cell may include an L-shaped floating gate, a control gate, an insulation layer coupled between the control gate and the first L-shaped floating gate, and a conductive layer coupled between the substrate and the first L-shape floating gate. Other embodiments including additional apparatus, systems, and methods are disclosed.

12 Claims, 26 Drawing Sheets

US 7,821,045 B2

APPARATUS, SYSTEM, AND METHOD FOR MULTIPLE-SEGMENT FLOATING GATE

FIELD

Embodiments of this disclosure relate to semiconductor devices, including flash memory devices.

BACKGROUND

Semiconductor devices such as flash memory devices are used to store data or information. Many computers and electronic devices, for example digital audio players, digital cameras, digital recorders, and cellular phones, have flash memory devices. Flash memory devices may also be used as portable storage devices such as portable Universal Serial Bus (USB) flash drives or "thumb" drives. Flash memory devices may not need power to maintain the information stored in the device.

A flash memory device may store information in numerous memory cells. Each of the memory cells often has a metal-oxide semiconductor (MOS) transistor with two different transistor gates: a control gate and a so-called "floating" gate. The control gate may be used to control access to the memory cell. The floating gate may be the place where one or more bits of information are stored in each memory cell.

For the reasons stated below which will become apparent to those skilled in the art upon reading and understanding the present disclosure, there is a need for apparatus, method, and systems for flash memory devices with novel structures.

DETAILED DESCRIPTION

Figure 1:
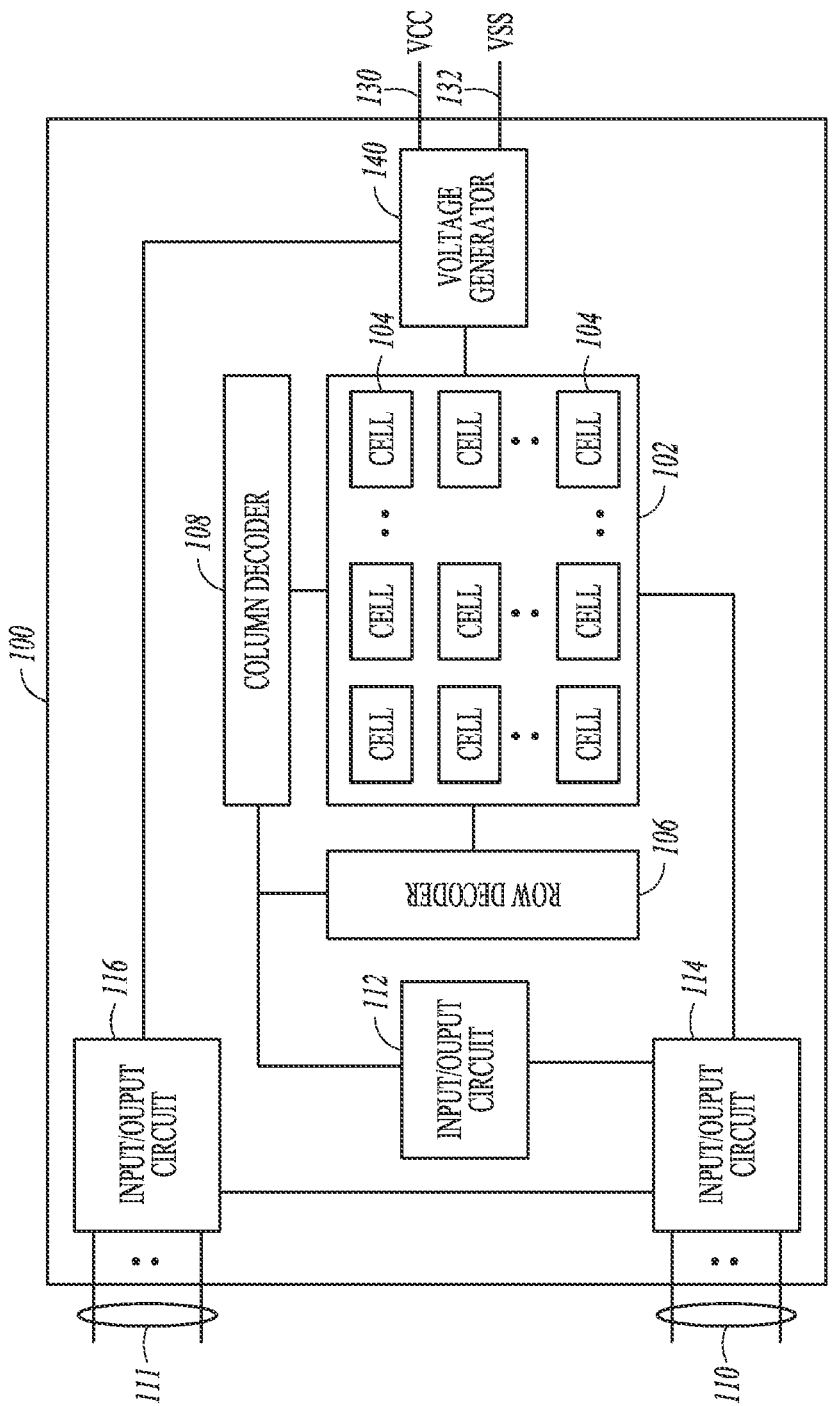
FIG. 1 shows a block diagram of an apparatus including a memory device according to an embodiment of the invention.

FIG. 1 shows a block diagram of an apparatus including a memory device 100 according to an embodiment of the invention. Memory device 100 may include a memory array 102 with memory cells 104 arranged in rows and columns. Row decoder 106 and column decoder 108 may respond to an address register 112 and access memory cells 104 based on row address and column address signals on lines 110. A data input/output circuit 114 may transfer data between memory cells 104 and lines 110. A control circuit 116 may control operations of memory device 100 based on signals on lines 110 and 111. Memory device 100 may be a flash memory device. In some embodiments, memory device 100 may include a NAND flash memory device where memory cells 104 may include flash memory cells arranged in a NAND flash memory arrangement. One skilled in the art will readily recognize that memory device 100 may include other parts, which are omitted from FIG. 1 to focus on the various embodiments described herein.

Memory device 100 may include nodes 130 and 132 to receive voltages Vcc and Vss. Vcc may be the supply voltage for memory device 100, and Vss may be ground. Memory device 100 may also include a voltage generator 140. Voltage generator 140 and control circuit 116 may act separately or together to provide different voltages to memory array 102, or to cause memory array 102 to have different voltages during various operations of memory device 100. The operations may include a programming operation to transfer or write data from lines 110 to memory cells 104, a read operation to transfer or read data from memory cells 104 to lines 110, and an erase operation to erase or clear data from all or a portion of memory cells 104. In some embodiments, memory device 100 may include embodiments of memory device 200, 500, 700, 800, and 2600 of FIG. 2 through FIG. 37 described below.

Figure 2:
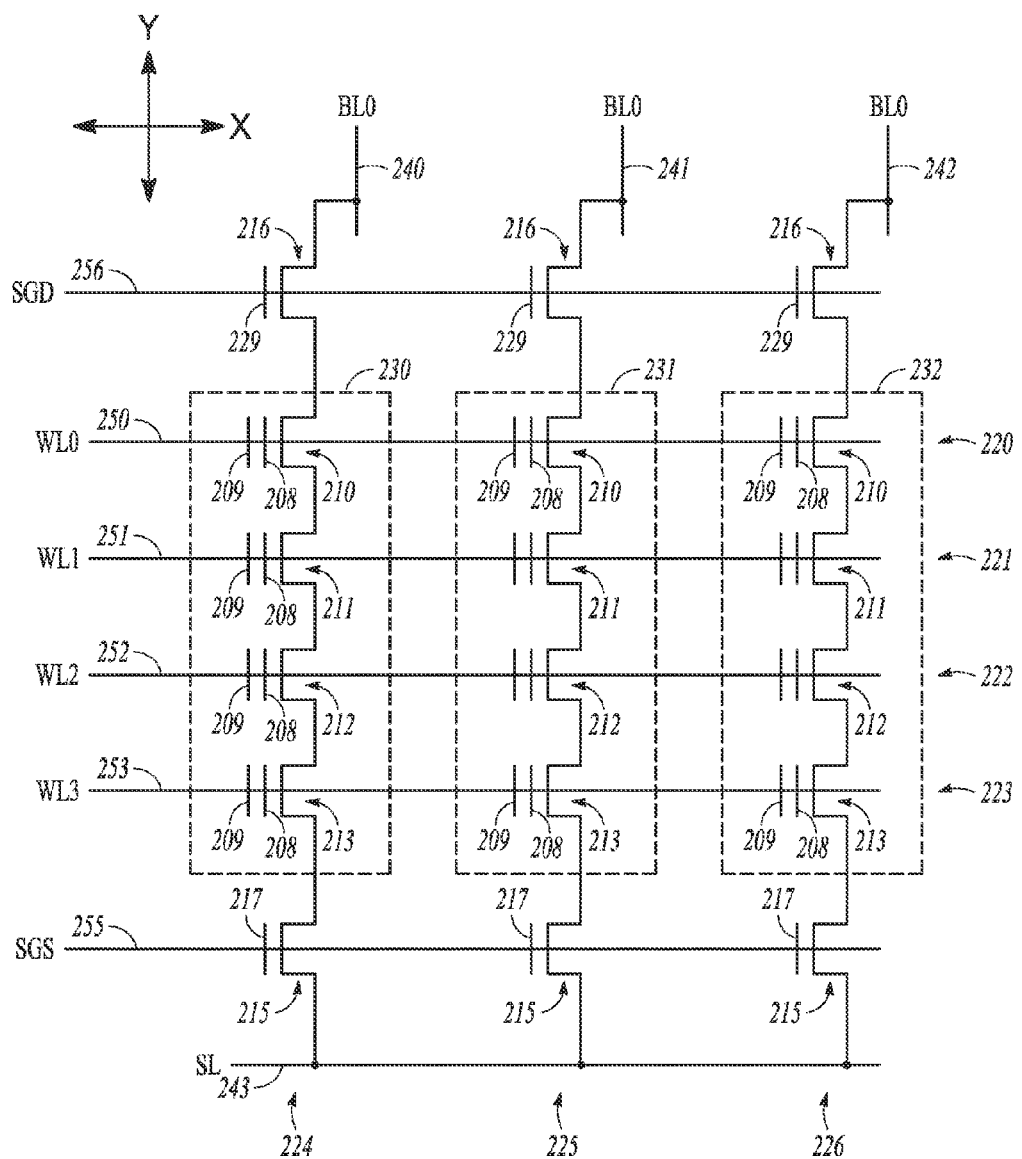
FIG. 2 shows a partial schematic diagram of a memory device according to an embodiment of the invention.

FIG. 2 shows a partial schematic diagram of a memory device 200 according to an embodiment of the invention. Memory device 200 may be included in memory device 100 of FIG. 1. In FIG. 2, memory device 200 may include a number of memory cells 210, 211, 212, and 213 arranged in rows 220, 221, 222, and 223, and columns 224, 225, and 226.

As shown in FIG. 2, each of rows 220, 221, 222, and 223 may extend in an X-axis dimension. Each of columns 224, 225, and 226 may extend in a Y-axis dimension. X-axis and Y-axis dimensions may correspond to two dimensions in a plan view and may be perpendicular or substantially perpendicular to each other.

The memory cells in the same column, such as columns 224, 225, and 226, may be connected in series or in a string of memory cells, such as strings 230, 231, and 232. FIG. 2 shows an example where each string 230, 231, and 232 may include four memory cells 210, 211, 212, and 213. In some embodiments, the number of memory cells in each of strings 231, 232, and 233 may vary. In FIG. 2, memory device 200 may include select transistors 215, each being coupled between one of strings 230, 231, and 232 and a source line 243 having source line signal SL. Each select transistor 215 may include a gate 217 coupled to a select line 255. A select signal SGS on select line 255 may be used to activate (turn on) select transistors 215. Memory device 200 may also include select transistors 216, each being coupled between one of strings 230, 231, and 232 and one of bit lines 240, 241, and 242 having corresponding bit line signals BL0, BL1, and BL2. Each select transistor 216 may include a gate 229 coupled to a select line 256. A select signal SGD on select line 256 may be used to activate select transistors 216.

Each of memory cells 210, 211, 212, and 213 may include a floating gate 208 and a control gate 209. Control gates 209 of memory cells (e.g., memory cell 210) in the same row (e.g., row 220) may be coupled to a word line such as one of word lines 250, 251, 252, and 253. Word line signals WL0, WL1, WL2, and WL3 on word lines 250, 251, 252, and 253 may be used to activate memory cells 210, 211, 212, and 213. FIG. 2 shows that the memory cells in the same row (e.g., row 220) may each include a separate control gate 209 coupled to a word line (e.g., word line 250). In some embodiments, control gates 209 within the same row may be a portion of the word line of that same row.

In FIG. 2, to program, read, or erase memory cells 210, 211, 212, and 213, appropriate voltages may be applied to select lines 255 and 256, word lines 250, 251, 252, and 253, bit lines 240, 241, and 242, and source line 243. Each floating gate 208 of memory cells 210, 211, 212, and 213 may include an L-shaped floating gate as described with reference to FIG. 3 through FIG. 7.

Figure 3:
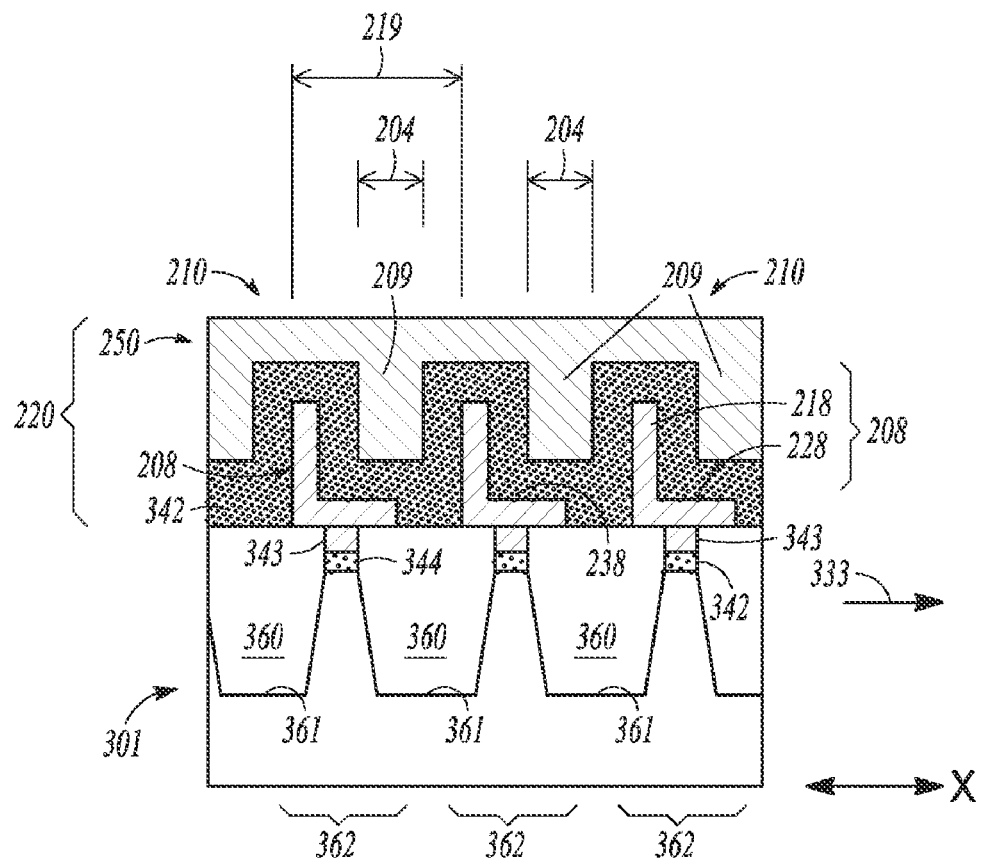
FIG. 3 shows a partial cross-section of the memory device of FIG. 2 in an X-direction.

FIG. 3 shows a partial cross-section of memory device 200 of FIG. 2 in the X-direction. FIG. 3 shows one row 220 of memory cells 210 including floating gates 208. Other rows 221, 222, and 223 (FIG. 2) of memory device 200 may have a structure similar or identical to the structure shown in FIG. 3.

In FIG. 3, each floating gate 208 may include segments 218 and 228 forming an L-shape; the L-shape may face a direction 333 in the X-axis dimension. As shown in FIG. 3, the entire structure of floating gate 208 may form the L-shape in which segments 218 and 228 may be substantially perpendicular to each other, segment 228 may be substantially parallel to a substrate 301, and segment 218 may be substantially perpendicular to or extending away from the substrate 301 and segment 228. As also shown in FIG. 3, segments 228 and 118 may join at their ends to form a corner 238. FIG. 3 shows corner 238 being about 90 degrees. In some embodiments, corner 238 may have be than 90 degrees. In some embodiments, corner 238 may have be more than 90 degrees.

In FIG. 3, floating gates 208 may be insulated from word line 250 by an insulation layer 342. A portion of word line 250 may form control gate 209 of each memory cell 210. Memory device 200 may include a conductive layer 343, and an insulation layer 344. Memory device 200 may also include a substrate 301 with isolation structures 360 having material filled in trenches 361 to isolate substrate portions 362. Substrate 301 may include a semiconductor substrate. As shown in FIG. 3, segment 228 of floating gate 208 may have a length in the X-dimension, and insulation layer 344 may have a length in the X-direction less than the length of segment 228. Each substrate portion 362 may include wells and source/drain regions such as those shown in FIG. 4.

In FIG. 3, a distance between two floating gates 208 may be a bit line pitch 219 of memory device 200. Control gate 209 may have thickness 204 between two floating gates 208. In some embodiments, bit line pitch 219 may be about 52 nanometers (nm) or less and thickness 204 may be about 10 m or less. In some embodiments, bit line pitch 219 may be about 70 nm and thickness 204 may be at least equal to 28 nm. In some embodiments, bit line pitch 219 may be about 100 nm and thickness 204 may be at least equal to 58 nm.

Floating gates 208 may introduce the following characteristics. As shown in FIG. 3, word line 250 wraps around the L-shape of floating gates 208 such that portion 209 may reside between two floating gates 208. Since each floating gate 208 may include only one vertical segment (e.g., segment 218), more room may exist between two floating gates 208. Thus, for a given bit line pitch 219 value, formation of word line wraparound between two floating gates 208 may be relatively more flexible or obtainable in comparison with word line wraparound between two conventional floating gates such as cubic-shaped and U-shaped floating gates. For example, for a given bit line pitch 219 value, such as 100 nm, 70 nm, 52 nm, or less than 52 nm, less room may exist between two conventional floating gates, in comparison with the L-shaped floating gates 208, because the shape of conventional floating gates may be restricted by practical feature dimensions. Therefore, formation of word line wraparound in convention floating gates may be restricted, difficult, or unobtainable.

Further, as memory cell size decreases, a bit line pitch value of a memory device, such as value of line pitch 219 of memory device 200 of FIG. 3, may also decrease. At some decreased bit line pitch value, forming memory cells with conventional floating gates may be difficult or impractical because features of the memory cells, besides the floating gates, may also be restricted to practical feature dimensions. For example, the thickness of an insulation layer (e.g., layer 342 of FIG. 3) that wraps around the floating gate may be restricted to some practical value for the device to function properly. Thus, for a give bit line pitch value (e.g., 100 nm, 70 nm, 52 nm, or less than 52 nm), the thickness of the insulation layer that wraps around the conventional floating gates may occupy a larger portion of the area within the bit line pitch, thereby leaving a smaller area portion within the bit line pitch. The smaller portion may have insufficient room for the formation of other features, for example, the formation of the word line wraparound between two conventional floating gates.

Figure 5:
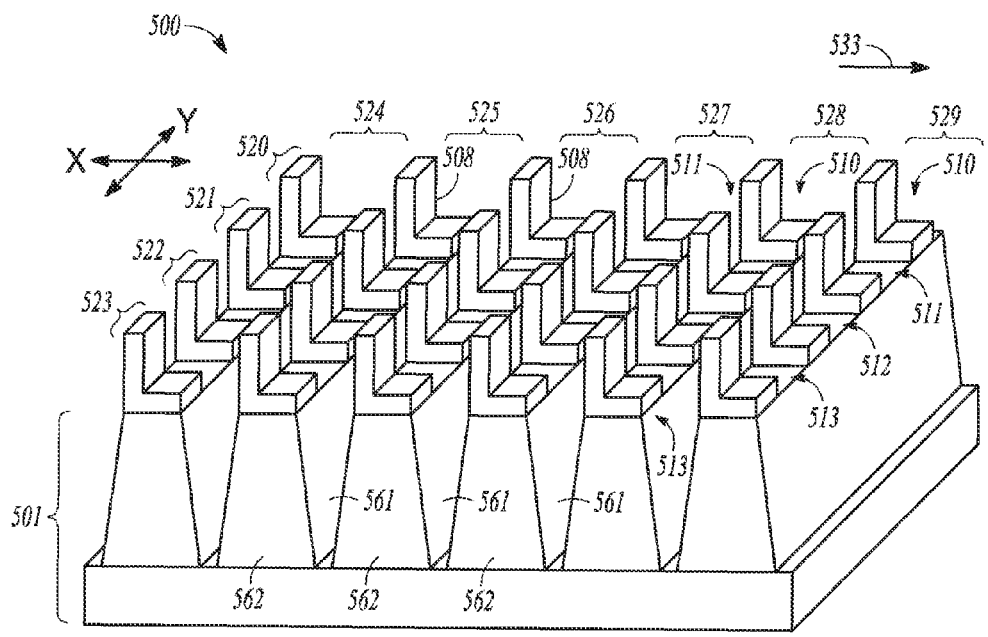
FIG. 5 shows a three-dimensional (3-D) view of a portion of a memory device with L-shaped floating gates according to an embodiment of the invention.

L-shape floating gates 208 of memory device 200 may also introduce the following characteristics: a lower floating gate to floating gate capacitive coupling ($C_{FG-FG}$), and a higher capacitive coupling ratio $C_{RATIO}$. A lower $C_{FG-FG}$ may reduce undesirable coupling noise in the device. A higher $C_{RATIO}$ may improve device performance. In comparison with conventional floating gates such as cubic-shaped floating gates, floating gates 208 may have a relatively smaller floating gate area between adjacent floating gates in the bit line direction (or Y-axis dimension as shown in FIG. 2 or FIG. 5) because of the L-shape of floating gates 208. The lower floating gate area may lead to a reduced $C_{FG-FG}$ among floating gates 208.

In FIG. 3, the capacitive coupling ratio $C_{RATIO}$ may generally be determined by the equation $C_{RATIO}=C_{WL-FG}/C_{TOTAL}$ in which $C_{TOTAL}$ may be the sum of $C_{WL-FG}$ and $C_{FG-SUB}$. $C_{WL-FG}$ may include a capacitive coupling between word line 250 (or control gate 209) and floating gate 208. $C_{FG-SUB}$ may include a capacitive coupling between floating gate 208 and the underneath feature such as feature in substrate portion 362. In comparison with a U-shaped floating gate, for a given $C_{RATIO}$, floating gates 208 of FIG. 3 may have a lower $C_{FG-FG}$ because parallel coupling between the word line wraparound (control gate 209) and floating gate 208 (which may include only one vertical segment) may be greater than the parallel coupling between the word line wraparound and the U-shaped floating gate (which has two vertical segments).

In some embodiments, in memory device 200, $C_{RATIO}$ may be about 0.637, $C_{FG-FG}/C_{TOTAL}$ may be about 0.83%, and $C_{TOTAL}$ may be about 41.1 attofarads.

Figure 4:
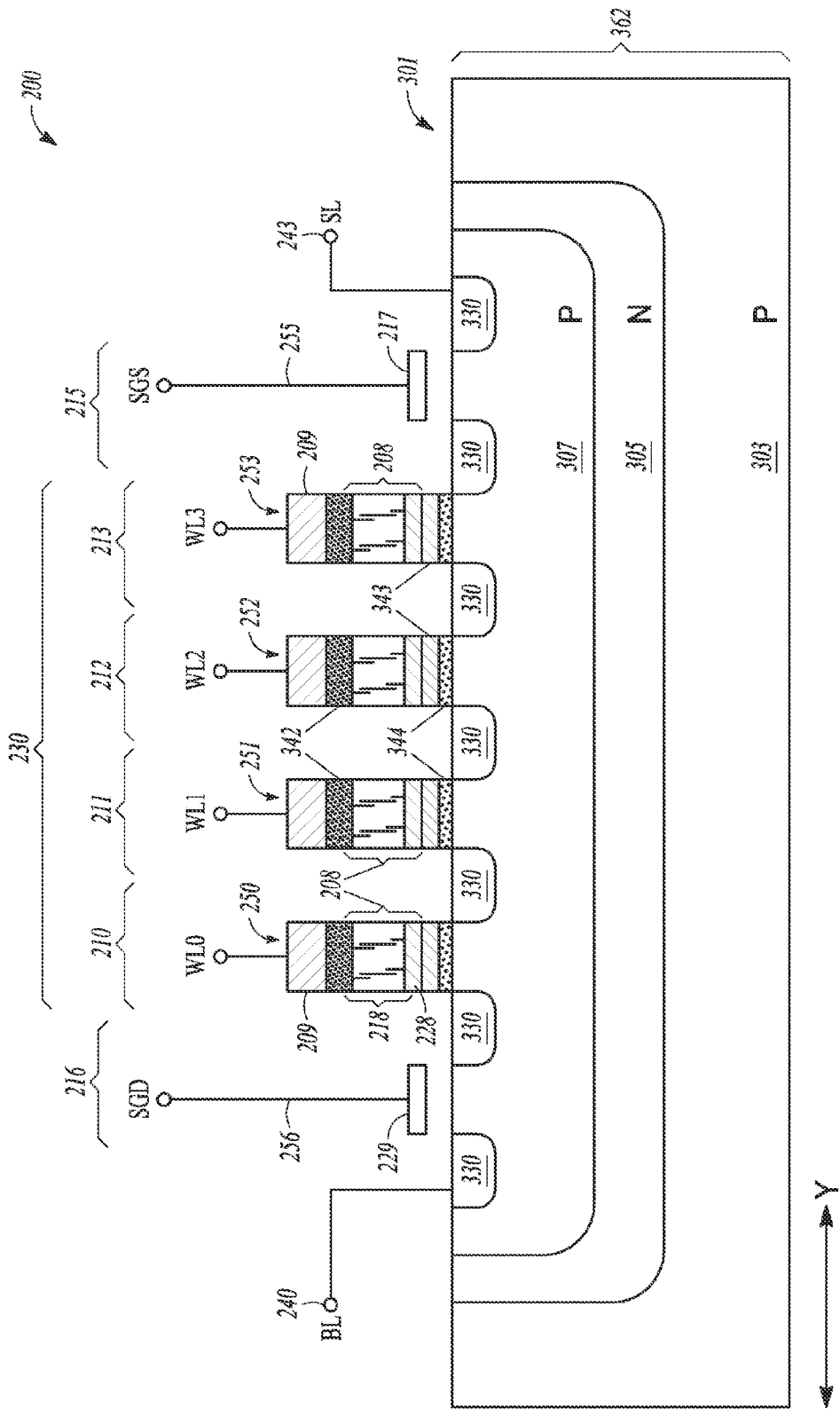
FIG. 4 shows a partial cross-section of the memory device of FIG. 2 in a Y-direction.

FIG. 4 shows a partial cross-section of memory device 200 of FIG. 2 in the Y-dimension. FIG. 4 shows one string of memory cells in a column (e.g., string 230 in column 244). Other strings of memory cells (e.g., strings 231 and 232 in FIG. 2) may have a structure similar or identical to the structure shown in FIG. 4. As shown in FIG. 4, substrate portion 362 of substrate 301 may include wells 303, 305, and 307. "P" and "N" in FIG. 4 indicate different semiconductor material types in various portions of substrate 301. Floating gate 208 and control gate 209 of each of memory cells 210, 211, 212, and 213 may be formed outside regions 330 and insulated from substrate 301 by insulation layer 344. Each region 330 may be either a source region or a drain region of a transistor. As shown in FIG. 4, each region 330 may also be source/drain region shared by two memory cells. FIG. 4 shows each of select transistors 215 and 216 with a single gate (e.g., gate 217 or 229). In some embodiments, each of select transistors 215 and 216 may include two gates, similar or identical to those in each of memory cells 210, 211, 212, and 213, but the two gates may be tied together (shorted) to act as a single gate transistor.

Figure 6:
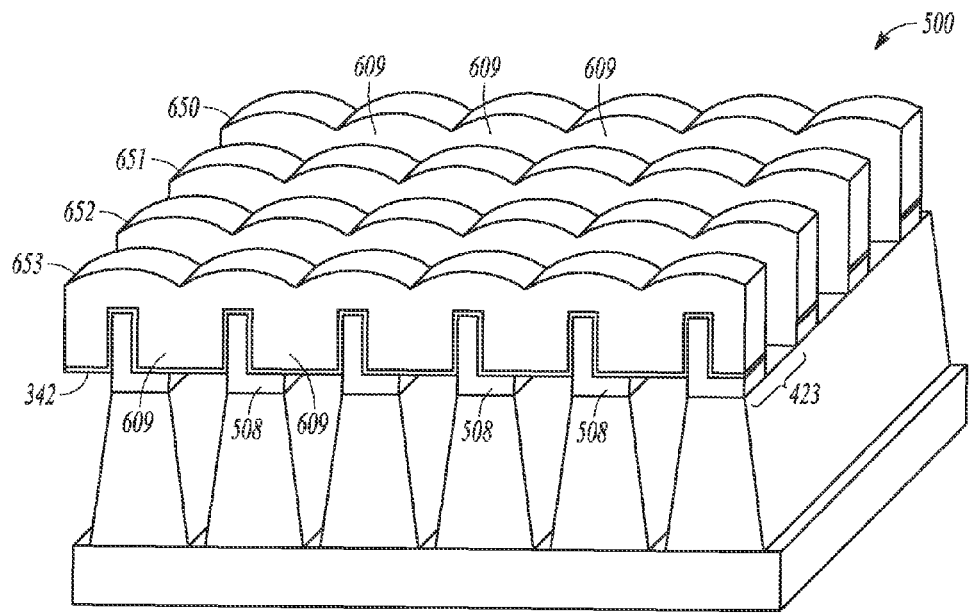
FIG. 6 shows the 3-D view of the portion of the memory device of FIG. 5 including word lines.

FIG. 5 shows a 3-D view of a portion of a memory device 500 with L-shaped floating gates 508 according to an embodiment of the invention. Memory device 500 may include a substrate 501, a number of memory cells 510, 511, 512, and 513 arranged in rows 520, 521, 522, and 523 in an X-axis dimension, and columns 524, 525, 526, 527, 528, and 529 in a Y-axis dimension. As shown in FIG. 5, each floating gate 508 may face a direction 533 in the X-axis dimension. Memory device 500 may include trenches 561 to isolate substrate portions 562. Each substrate portion 562 may include one or more well and source/drain regions, such as wells 305 and 307 and source/drain regions 330 of FIG. 3. For clarity, FIG. 5 omits word lines of memory device 500. Word lines of memory device 500 are shown in FIG. 6. Also for clarity, FIG. 5 omits features such as material filled in each trench 561, and insulation layers such as insulation layers 342 and 344 of FIG. 4. L-shape floating gates 508 may include characteristics of floating gates 408 described above with reference to FIG. 3.

FIG. 6 shows the 3-D view of the portion of memory device 500 of FIG. 5 including word lines 650, 651, 652, and 653. For clarity, FIG. 6 omits some of the features of memory device 500 that are shown in FIG. 3 and FIG. 4. As shown in FIG. 6, each of word lines 650, 651, 652, and 653 may overlie floating gates 508 in the same row and insulated from floating gates 508 by insulation layer 342. For example, word line 653 may overlie floating gate 508 of each of the memory cells in row 423. Each of word lines 650, 651, 652, and 653 may include word line portions 609 such that each word line portion 609 may form a control gate for one of the memory cells in the same row.

Figure 7:
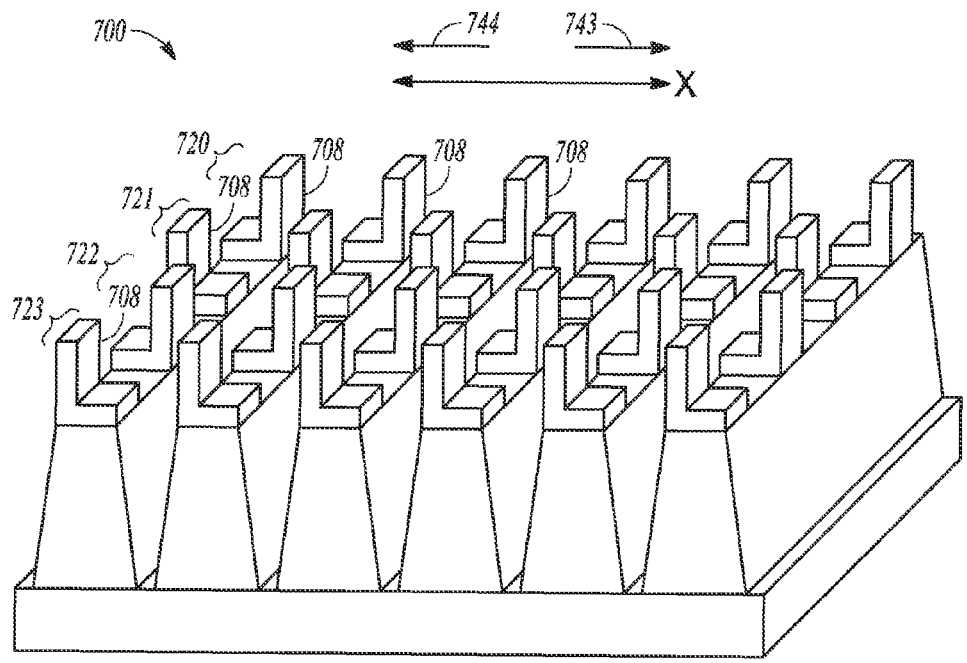
FIG. 7 shows a 3-D view of a portion of a memory device with mirrored L-shaped floating gates according to an embodiment of the invention.

FIG. 7 shows a 3-D view of a portion of a memory device 700 with mirrored L-shaped floating gates 708 according to an embodiment of the invention. Memory device 700 may be similar to memory device 500 shown in FIG. 5 except for the arrangement of L-shaped floating gates 708. As shown in FIG. 7, L-shaped floating gates 708 may be arranged in rows 720, 721, 722, and 723. FIG. 7 shows two directions 733 and 744 along an X-axis dimension. L-shaped floating gates 708 in the same row may face the same direction, either direction 733 or direction 744. However, L-shaped floating gates 708 in two rows that are immediately next to each other may face different directions. For example, L-shaped floating gates 708 in row 720 may face direction 744 whereas L-shaped floating gates 708 in row 721 may face direction 733. Similarly L-shaped floating gates 708 in row 722 may face direction 744 whereas floating gates 708 in row 723 may face direction 733. With the arrangement shown in FIG. 7, floating gates 708 may be called mirrored L-shaped floating gates.

Mirrored L-shape floating gates 708 may include the characteristics of floating gates 208 described above with reference to FIG. 3. Moreover, in comparison with the L-shape floating gate of FIG. 3 or FIG. 5, the mirrored L-shape floating gates 708 of FIG. 7 may have further reduction in $C_{FG-FG}$ because, as shown in FIG. 7, the vertical segments of mirrored L-shape floating gates 708 may be alternately arranged or staggered in the Y-axis dimension. The staggering may make the distance between the vertical segments of floating gates 708 greater than the distance between the vertical segments of floating gates 208 of FIG. 3. Therefore, $C_{FG-FC}$, among floating gates 708 may be further reduced in comparison with $C_{FG-FG}$ of floating gates 208 of FIG. 3.

In some embodiments, in memory device 700 of FIG. 7, $C_{RATIO}$ may be about 0.640, $C_{FG-FG}/C_{TOTAL}$ may be about 0.62%, and $C_{TOTAL}$ may be about 40.9 attofarads.

In some embodiments, one or more of memory device 100, 200, 500, and 700 of FIG. 1 through FIG. 7 may be formed by a method described with reference to FIG. 8 through FIG. 37.

FIG. 8 through FIG. 25 show various activities of a method of forming a memory device with L-shaped floating gates according to an embodiment of the invention.

Figure 8:
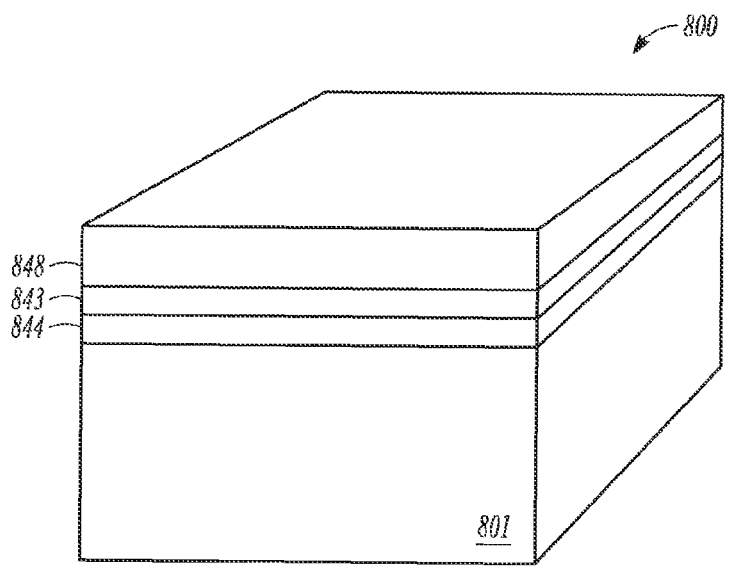
FIG. 8 through FIG. 25 show various activities of a method of forming a memory device with L-shaped floating gates according to an embodiment of the invention.

FIG. 8 shows a portion of a memory device 800, including a substrate 801, an insulation layer 844, a conductive layer 843, and a layer 848 overlying substrate 801. Substrate 801 may include a silicon substrate. Insulation layer 844 may include an oxide of silicon or other non-conductive material. Conductive layer 843 may include polycrystalline silicon or other conductive material. Layer 848 may include silicon nitride or other material.

Figure 9:
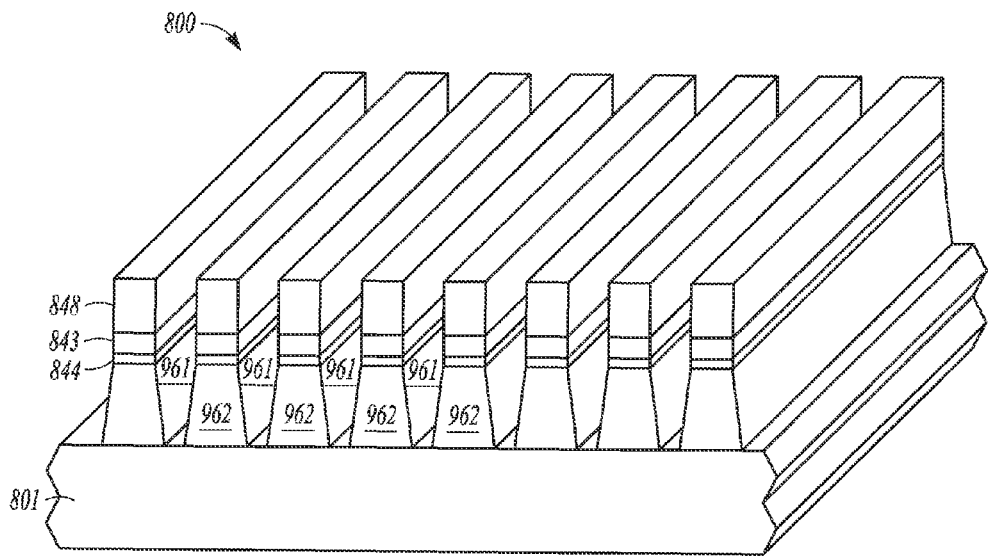

FIG. 9 shows a portion of memory device 800, including trenches 961 isolating substrate portions 962. Trenches 961 may be formed by removing a portion of each of insulation layer 844, conductive layer 843, layer 848, and substrate 801. In the description herein, removing a material or removing a portion of a structure may be performed by etching or by other techniques.

Figure 10:
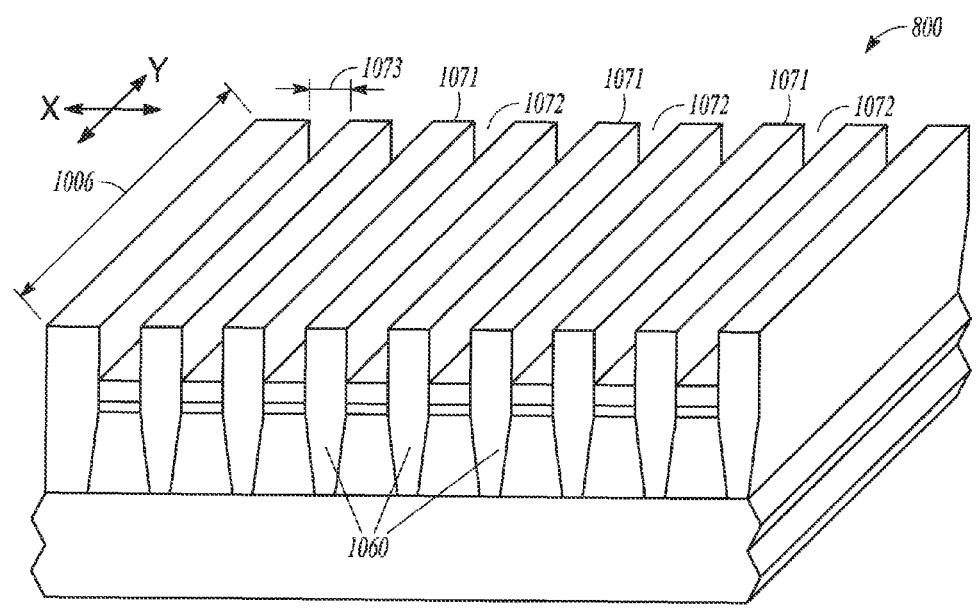

FIG. 10 shows memory device 800, including isolation structures 1060, ridges 1071, and gaps 1072 interleaved with ridges 1071. Isolation structures 1060 may be formed by filling trenches 961 with material such as an oxide of silicon or other non-conductive material. Ridges 1071 may be formed by depositing on isolation structures 1060 a material such as an oxide of silicon or other non-conductive material. In some embodiments, isolation structures 1060 and ridges 1071 may be formed at the same time (e.g., the same deposition of material). In FIG. 10 gaps 1072 may be formed by removing layer 848 (FIG. 9) after ridges 1071 and isolation structures 1060 are formed. As shown in FIG. 10, each gap 1072 has a width 1073 in an X-axis dimension, and each ridge 1071 has a length 1006 in a Y-axis dimension.

Figure 11:
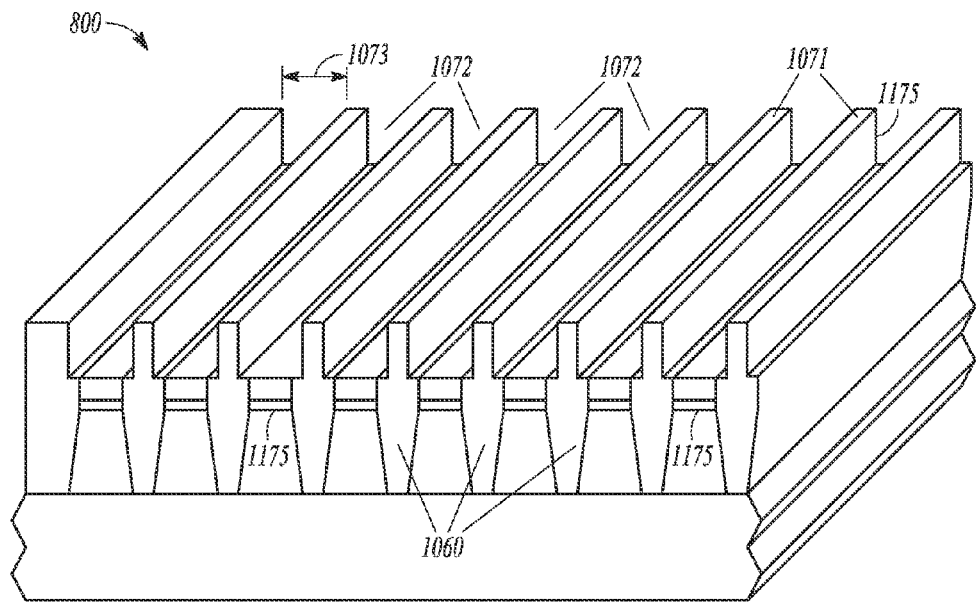

FIG. 11 shows memory device 800 after the width 1073 of each gap 1072 may be increased, e.g., by removing material from one or both of sidewalls 1175 of each of ridge 1071. In some embodiments, activities described with reference to FIG. 11 may be omitted such that width 1073 may remain unchanged.

Figure 12:
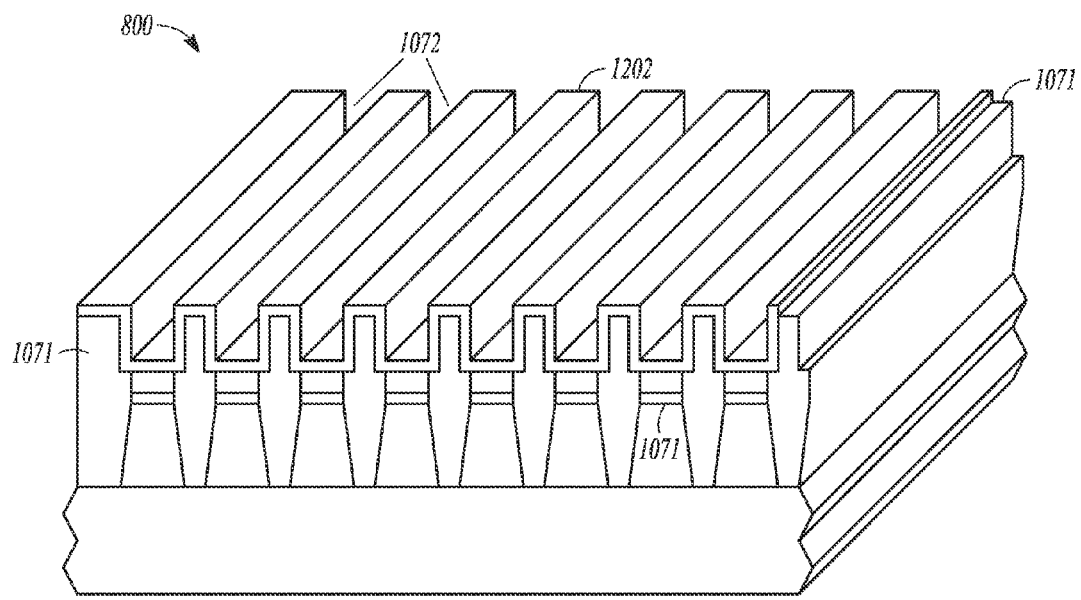

FIG. 12 shows memory device 800 after a conductive layer 1202 may be formed. As shown in FIG. 12, conductive layer 1202 may conform to ridges 1071 and gaps 1072. Conductive layer 1202 may include polycrystalline silicon or other conductive material.

Figure 13:
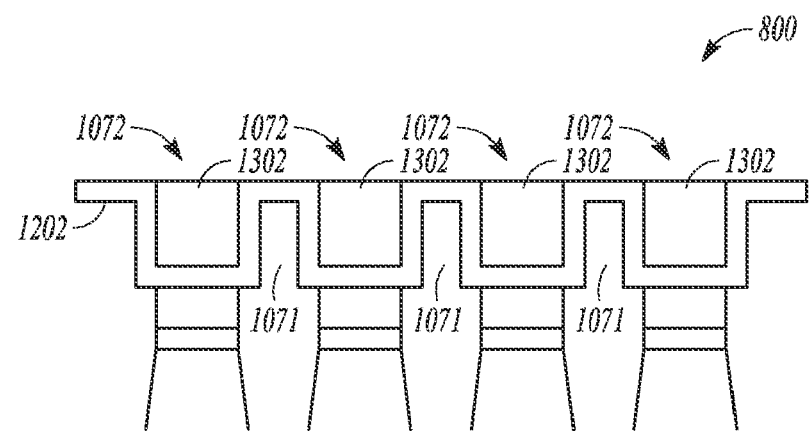

FIG. 13 shows memory device 800 after a material 1302 may fill areas of conductive layer 1202 in gaps 1072.

Figure 14:
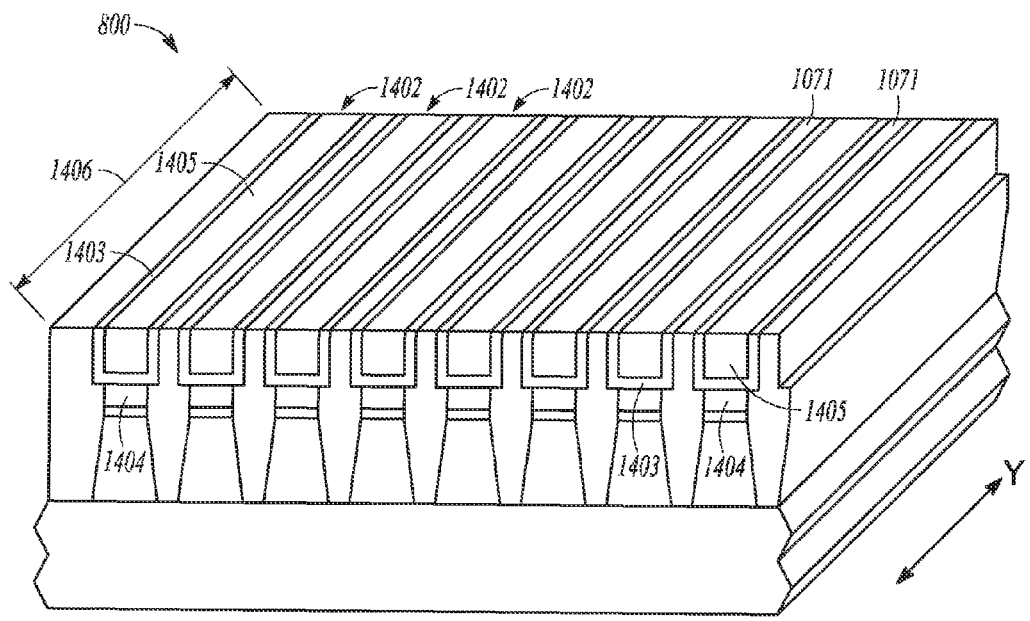

FIG. 14 shows memory device 800 after conductive strips 1402 are formed in gaps 1072. Conductive strips 1402 may be formed by removing a portion of conductive layer 1202 that overlies ridges 1071. Thus, in FIG. 13 and FIG. 14, the activity of filling areas of conductive layer 1202 (FIG. 13) with material 1302 may also be viewed as filling an internal area of each of conductive strips 1402 (FIG. 14) with material 1302. Each conductive strip 1402 may include segments 1403, 1404, and 1405. As shown in FIG. 14, each conductive strip 1402 may have a U-shape and a length 1406 in the Y-axis dimension.

Figure 15:
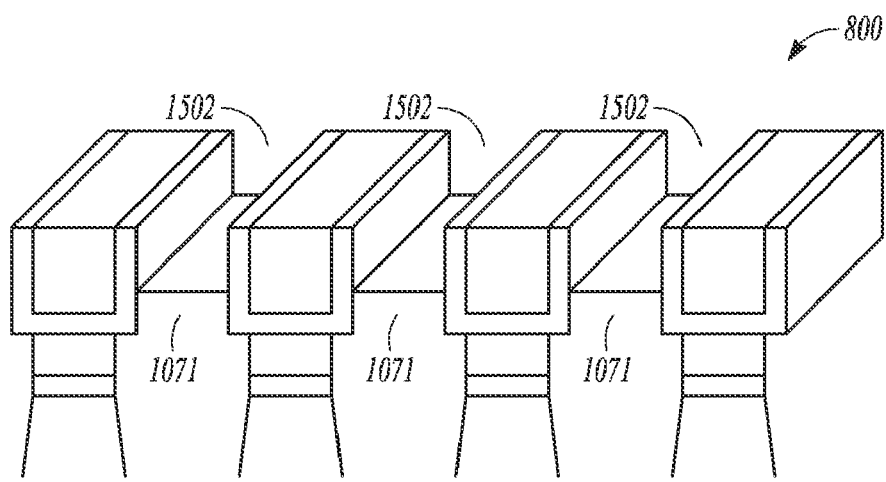

FIG. 15 shows memory device 800 after removal of a material from a portion 1502 of each ridge 1071.

Figure 16:
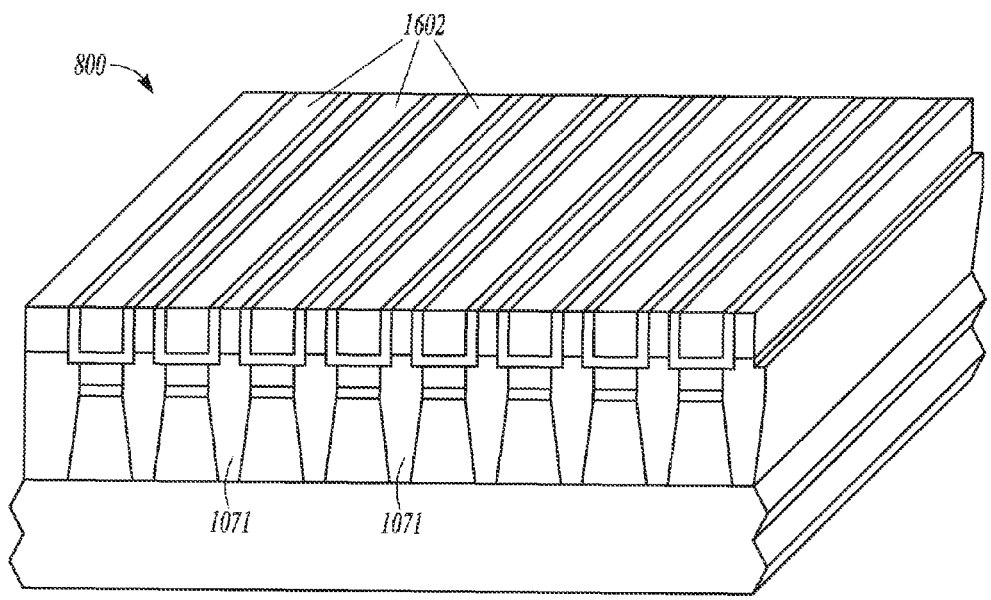

FIG. 16 shows memory device 800 with material 1602 that has filled portion 1502 of each ridge 1071. Material 1602 may be different from the material of ridges 1071 that is removed from portion 1502 (FIG. 15). As described above, each ridge 1071 may include a material such as an oxide of silicon. In FIG. 16, material 1602 may include silicon nitride, carbon or carbon-based material, or other materials. Replacing the material (e.g., an oxide of silicon) in portion 1502 of FIG. 15 of each ridge 1071 with a different material 1602 of FIG. 16 (e.g., a nitride or carbon-based material) may improve control of a subsequent activity (e.g., in FIG. 20). For example, since material 1602 and the material of ridges 1071 may have different material characteristics, material 1602 may be selectively removed.

Figure 17:
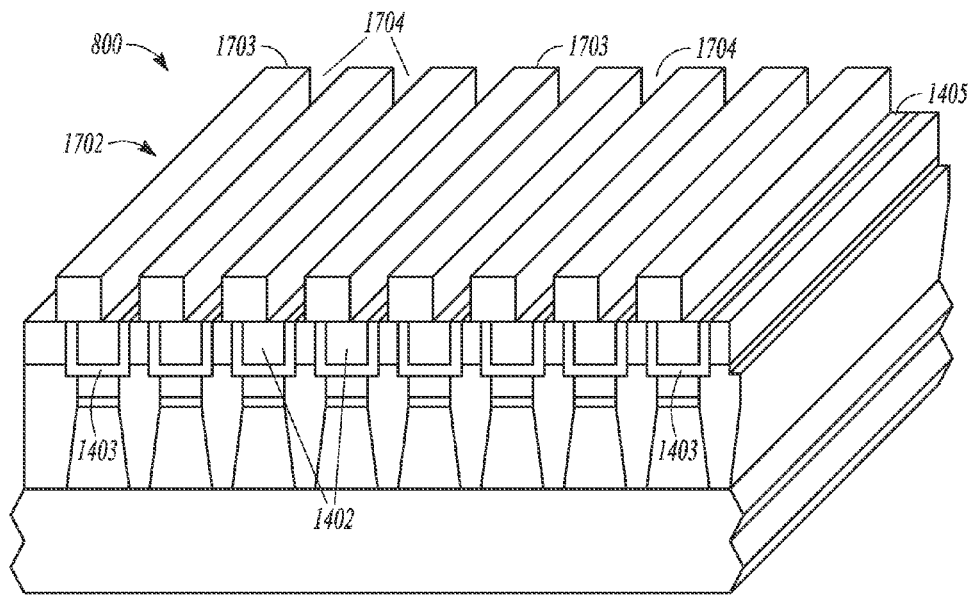

FIG. 17 shows a mask 1702 applied to memory device 800. Mask 1702 may include mask portions 1703 and openings 1704. Mask portions 1703 may include photoresist material. As shown in FIG. 17, mask portions 1702 may mask segment 1403 of each conductive strip 1402. Openings 1704 may leave segment 1405 of each conductive strip 1402 unmasked.

Figure 18:
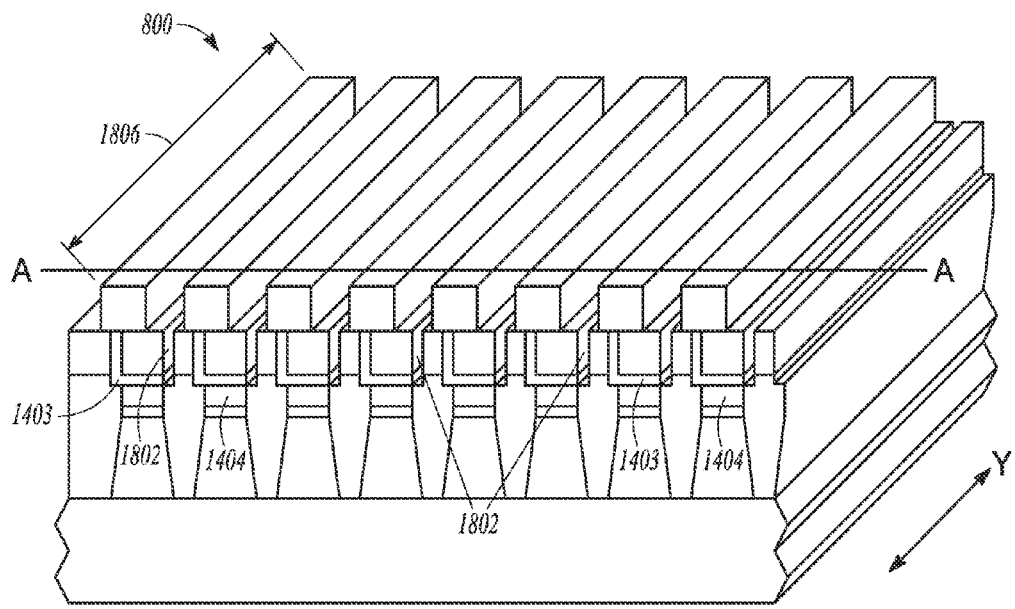

FIG. 18 shows memory device 800 after remaining conductive strips 1802 may be formed. Each remaining conductive strip 1802 may be formed after segment 1405 (FIG. 15) of each conductive strip 1402 is removed. Thus, each remaining conductive strip 1802 may include segments 1403 and 1404. As shown in FIG. 18, each remaining conductive strip 1802 may have an L-shape and a length 1806 in the Y-axis dimension. A cross-section of memory device 800 along line A-A is shown in FIG. 19.

Figure 19:
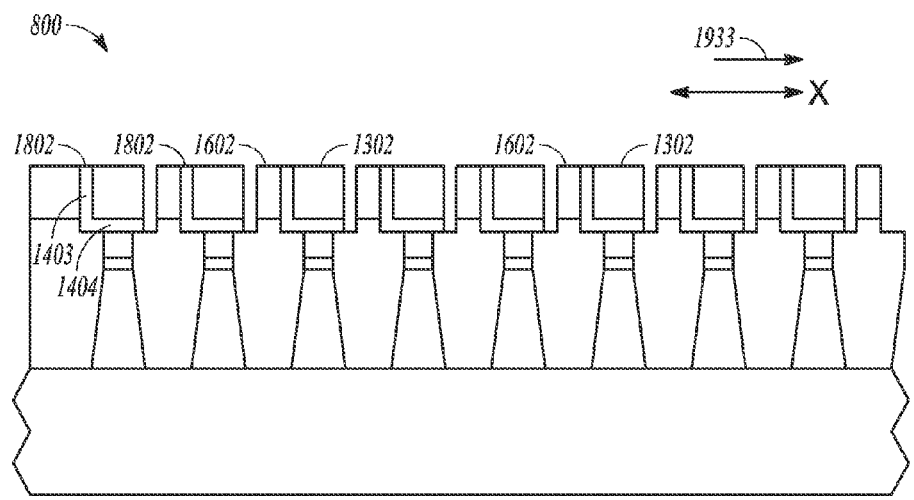

FIG. 19 shows a cross-section of memory device 800, including remaining conductive strips 1802 with segments 1403 and 1404, material 1302, and material 1602. As shown in FIG. 19, each remaining conductive strip 1802 may have an L-shape and face a direction 1933 in the X-axis dimension.

Figure 20:
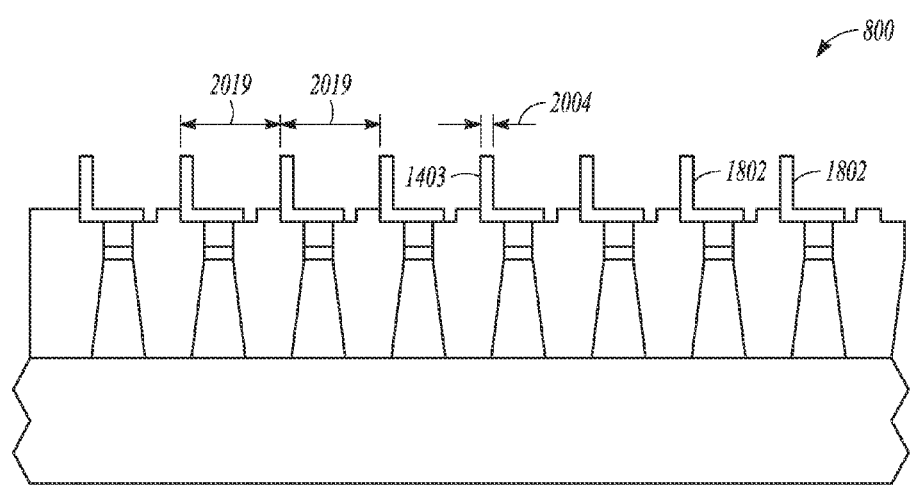

FIG. 20 shows a cross-section of memory device 800, including remaining conductive strips 1802 after removal of material 1302 and 1602 (FIG. 19). In FIG. 20, a distance between two remaining conductive strips 1802 in the X-axis dimension may be a bit line pitch 2019 of memory device 800. FIG. 20 also shows a thickness 2004 of segment 1403.

Figure 21:
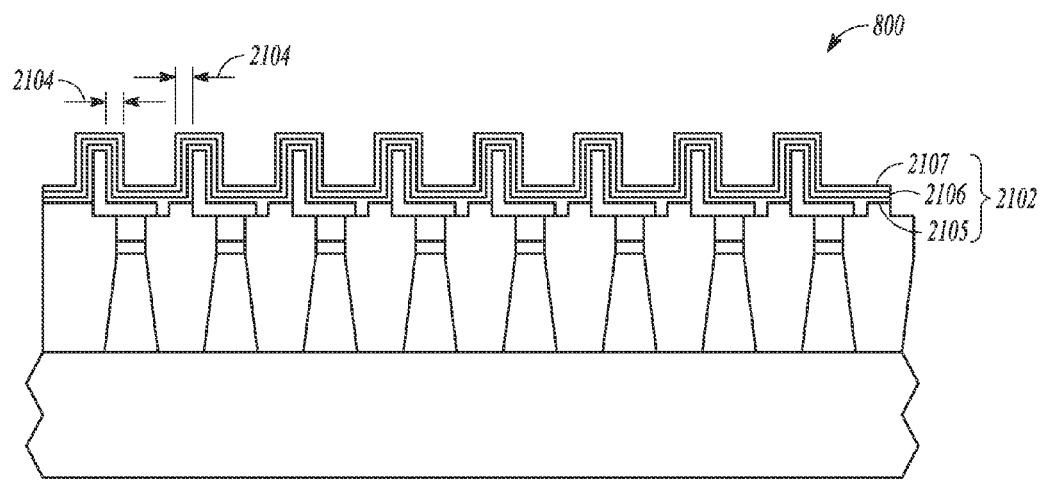

FIG. 21 shows memory device 800 after an insulation layer 2102 may be formed. Insulation layer 2102 may have a thickness 2104 and may include multiple layers 2105, 2106, and 2107. Each of layers 2105 and 2107 may include an oxide of silicon. Layer 2106 may include silicon nitride. Insulation layer 2102 may have an oxide-nitride-oxide (ONO) structure.

Figure 22:
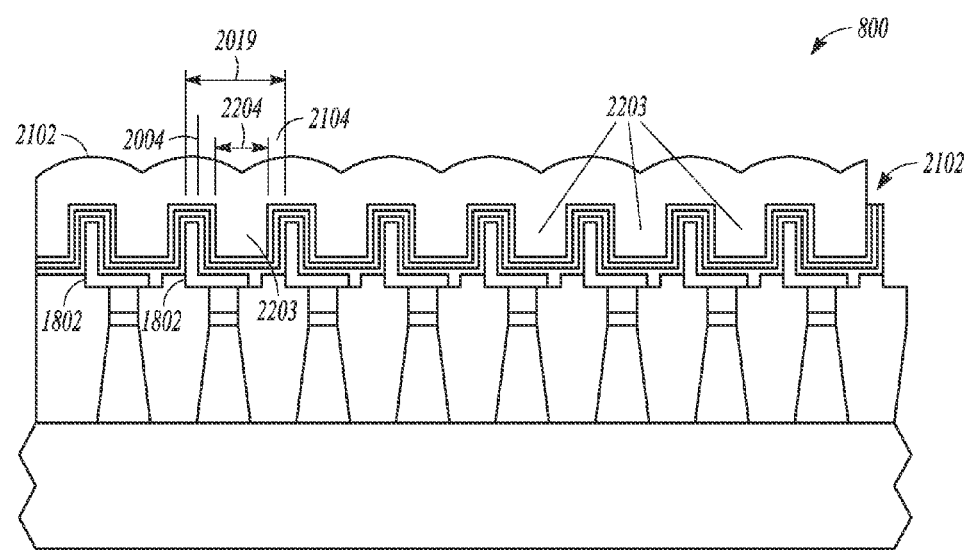

FIG. 22 shows memory device 800 after a conductive layer 2202 may be formed, overlying insulation layer 2102 and remaining conductive strips 1802. Conductive layer 2202 may include polysilicon or other conductive material. As shown in FIG. 22, conductive layer 2202 may include conductive portion 2209 between two remaining conductive strips 1802. Each conductive portion 2209 may have a thickness 2204. As shown in FIG. 22, bit line pitch 2019 may be a sum of thickness 2004 of segment 1403, thickness 2204 of conductive portion 2209, and two times of thickness 2104 of insulation layer 2102. The thickness in FIG. 22 may not be scaled.

In some embodiments, the value of thickness 2004 may be at least 19 percent of the value of bit line pitch 2019. For example, in some embodiments, bit line pitch 2019 may be about 56 nm, thickness 2104 may be about 16 nm or less, and thickness 2204 may be about 10 nm or less, such that thickness 2004 may be at least 10 nm.

In some embodiments, the value of thickness 2004 may be at least 40 percent of the value of bit line pitch 2019. For example, in some embodiments, bit line pitch 2019 may be about 70 nm, thickness 2104 may be about 16 nm or less, and thickness 2204 may be about 10 nm or less, such that thickness 2004 may be at least 28 nm.

In some embodiments, the value of thickness 2004 may be at least 58 percent of the value of bit line pitch 2019. For example, in some embodiments, bit line pitch 2019 may be about 100 nm, thickness 2104 may be about 16 nm or less, and thickness 2204 may be about 10 nm or less, such that thickness 2004 may be at least 58 nm.

Figure 23:
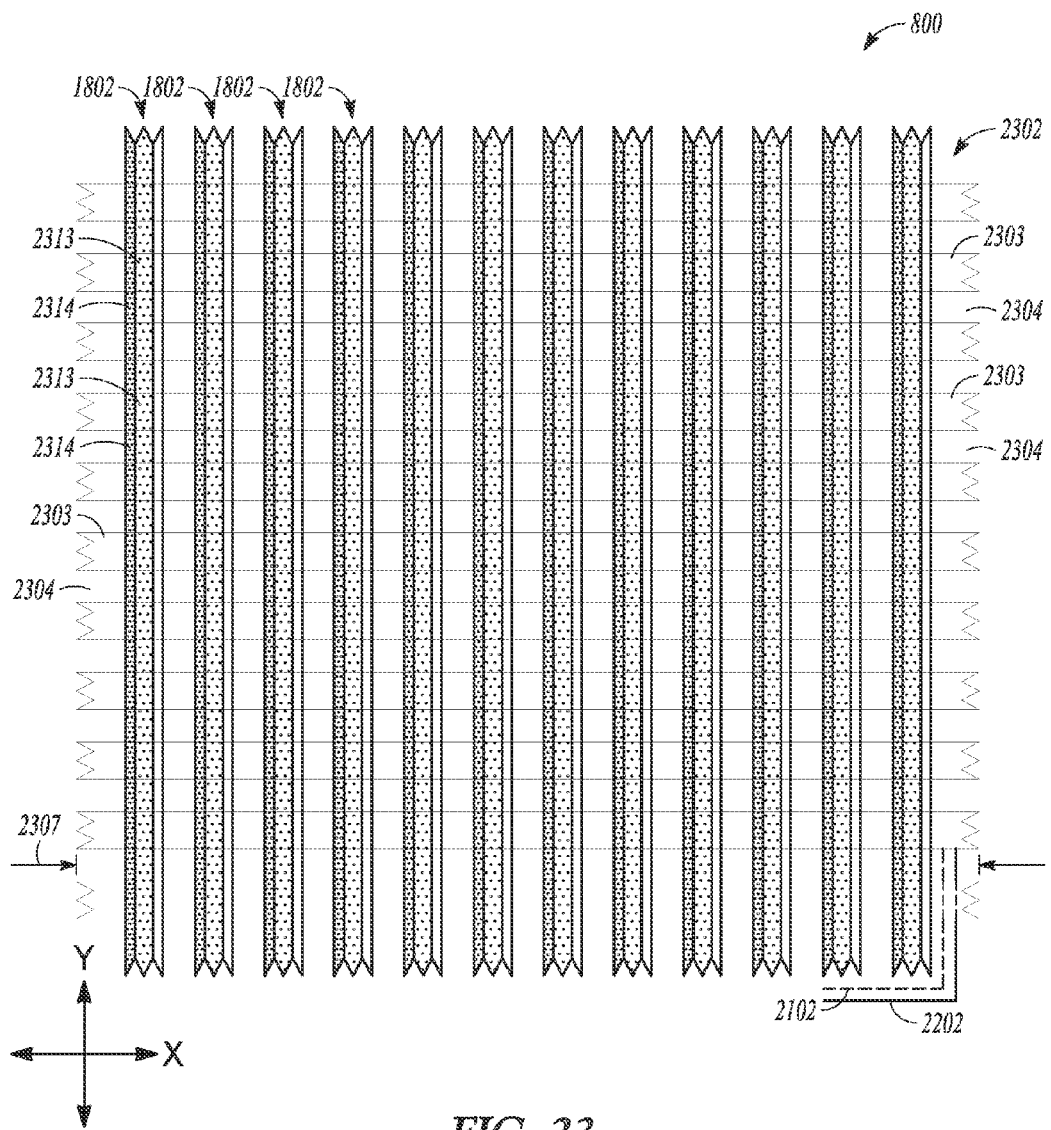

FIG. 23 shows a top view of memory device 800 after a mask 2302 may be applied. For clarity, in FIG. 23, conductive layer 2202 and insulation layer 2102 are partially shown. Mask 2302 may overlie conductive layer 2202, insulation layer 2102, and remaining conductive strips 1802. Mask 2302 may include mask portions 2303 and openings 2304. Mask portions 2303 may include photoresist material. Mask portions 2303 may mask portions 2313 of each remaining conductive strip 1802. Each of openings 2304 may have length 2307 in the X-axis dimension. Openings 2304 may expose portions 2314 of each remaining conductive strip 1802 such that portions 2314 may interleave with portions 2313 in the Y-axis dimension. Portions 2314 of remaining conductive strips 1802, portions of conductive layer 2202 in openings 2304, and portions of insulation layer 2102 in openings 2304 may be removed.

Figure 24:
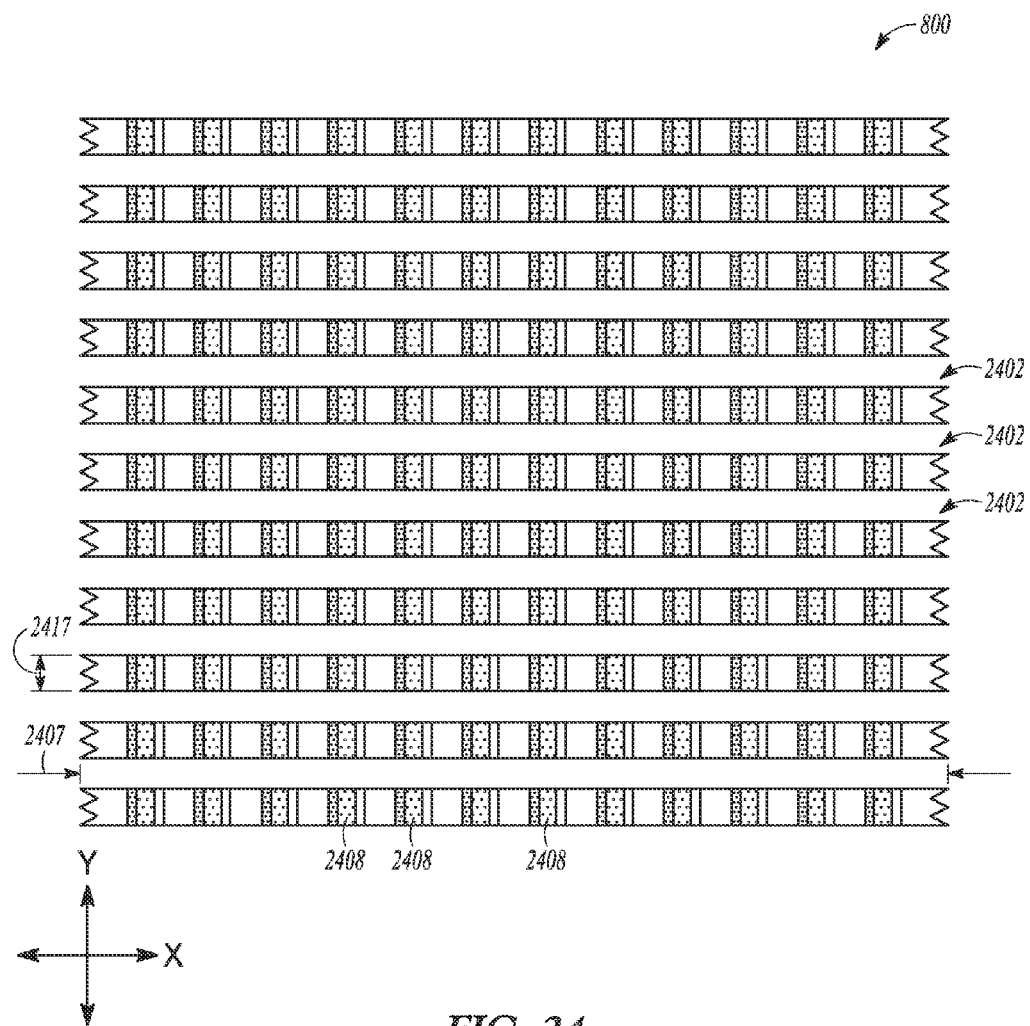

FIG. 24 shows memory device 800 after removal of portions 2314 of remaining conductive strips 1802 (FIG. 23), portions of conductive layer 2202 in openings 2304, and portions of insulation layer 2102 in openings 2304. As shown in FIG. 24, structures 2402 may be formed. Each structure 2402 may have a length 2407 in the X-axis dimension, and a width 2417 in the Y-axis dimension. Each structure 2402 may include a row of floating gates 2408.

Figure 25:
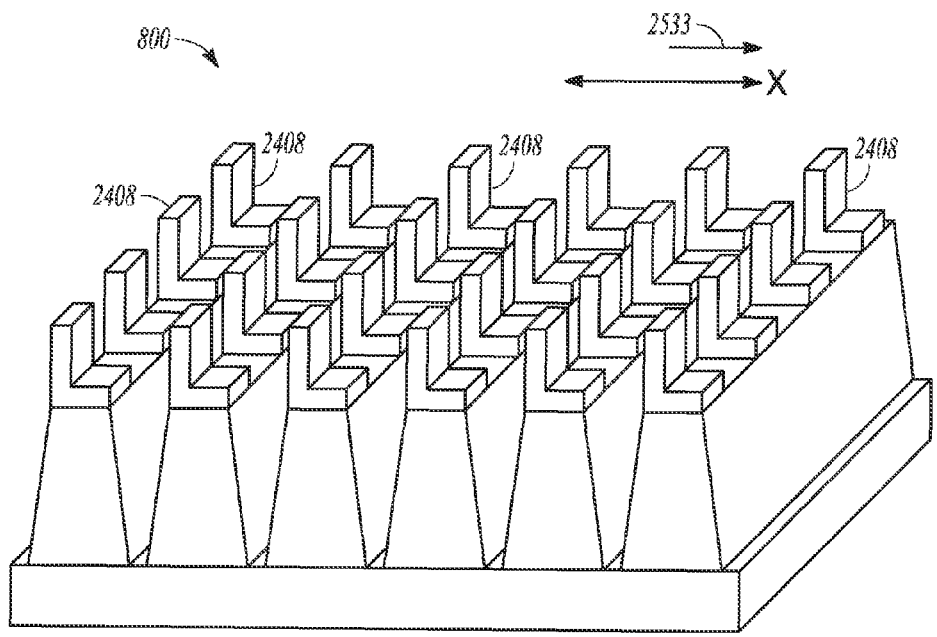

FIG. 25 shows a 3-D view of memory device 800 of FIG. 24 with floating gates 2408. For clarity, FIG. 25 omits some features, such as word lines overlying floating gates 2408. Memory device 800 of FIG. 25 may be similar or identical to memory device 500 of FIG. 6. As shown in FIG. 25, each floating gate 2408 may have an L-shape and face direction 2533 in the X-axis dimension.

The description above with reference to FIG. 8 through FIG. 25 shows various activities of a method of forming a memory device according to an embodiment of the invention, such as memory device 800 with L-shaped floating gates such as L-shaped floating gates 2508 shown in FIG. 25.

FIG. 26 through FIG. 37 show various activities of a method of forming a memory device with mirrored L-shaped floating gates according to an embodiment of the invention. In some embodiments, one or more of memory devices 100, 200, 500, and 700 (FIG. 1 through FIG. 7) may be formed by the method described in reference to FIG. 26 through FIG. 37.

Figure 26:
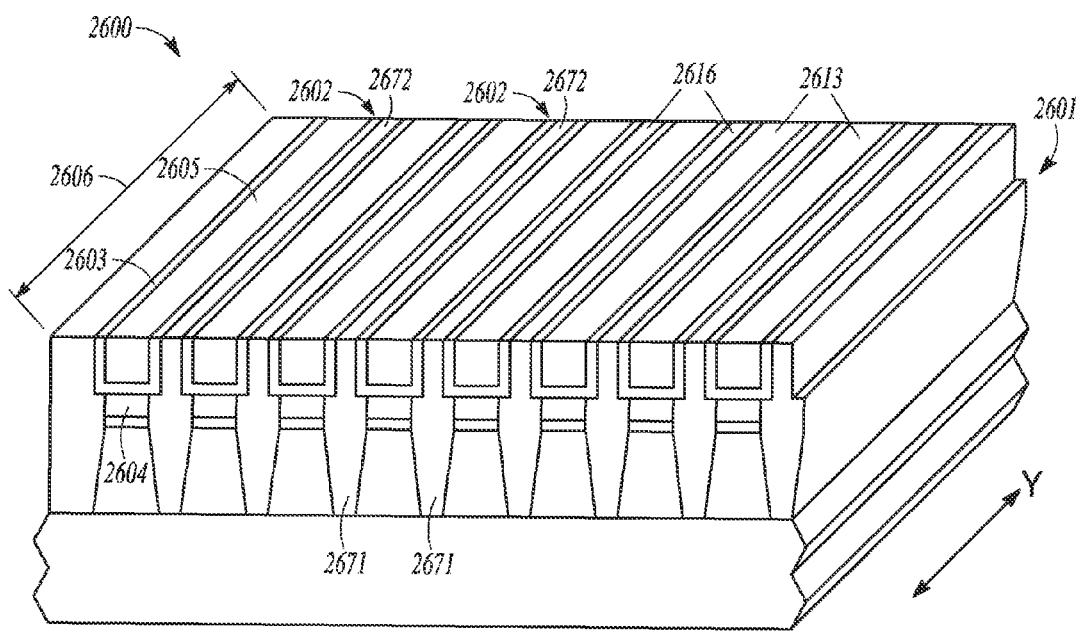
FIG. 26 through FIG. 37 show various activities of a method of forming a memory device with mirror L-shaped floating gates according to an embodiment of the invention.

FIG. 26 shows a memory device 2600 including a substrate 2601, conductive strips 2602 formed in gaps 2672, material 2613 filling an internal area of each conductive strip 2602, and material 2616 overlying ridges 2671. Each conductive strip 2602 may include segments 2603, 2604, and 2605. As shown in FIG. 26, each conductive strip 2602 may have a U-shape and a length 2606 in the Y-axis dimension. Memory device 2600, as shown in FIG. 26, may be formed by activities similar or identical to the activities described above with reference to FIG. 8 through FIG. 25.

Figure 27:
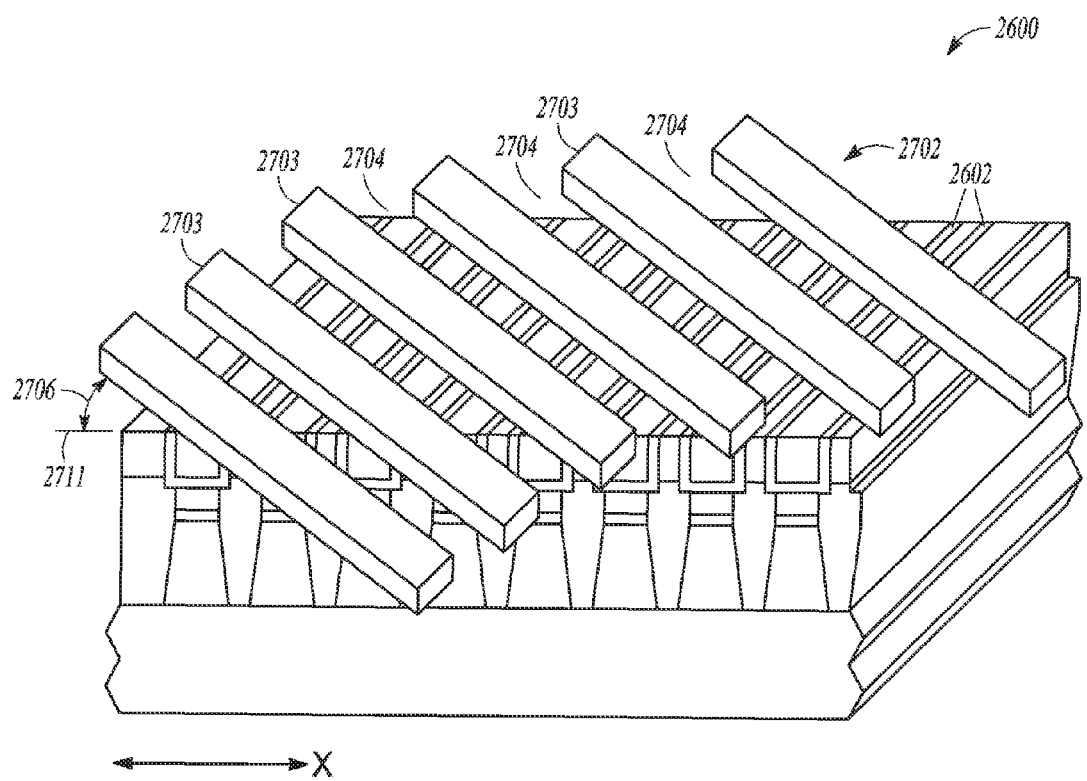

FIG. 27 shows a mask 2702 placed over conductive strips 2602 of memory device 2600. Mask 2702 may include mask portions 2703 and openings 2704. Mask portions 2703 may include photoresist material. As shown in FIG. 27, mask 2702 may be placed at an angle 2706 relative to line 2711 in an X-axis dimension.

Figure 28:
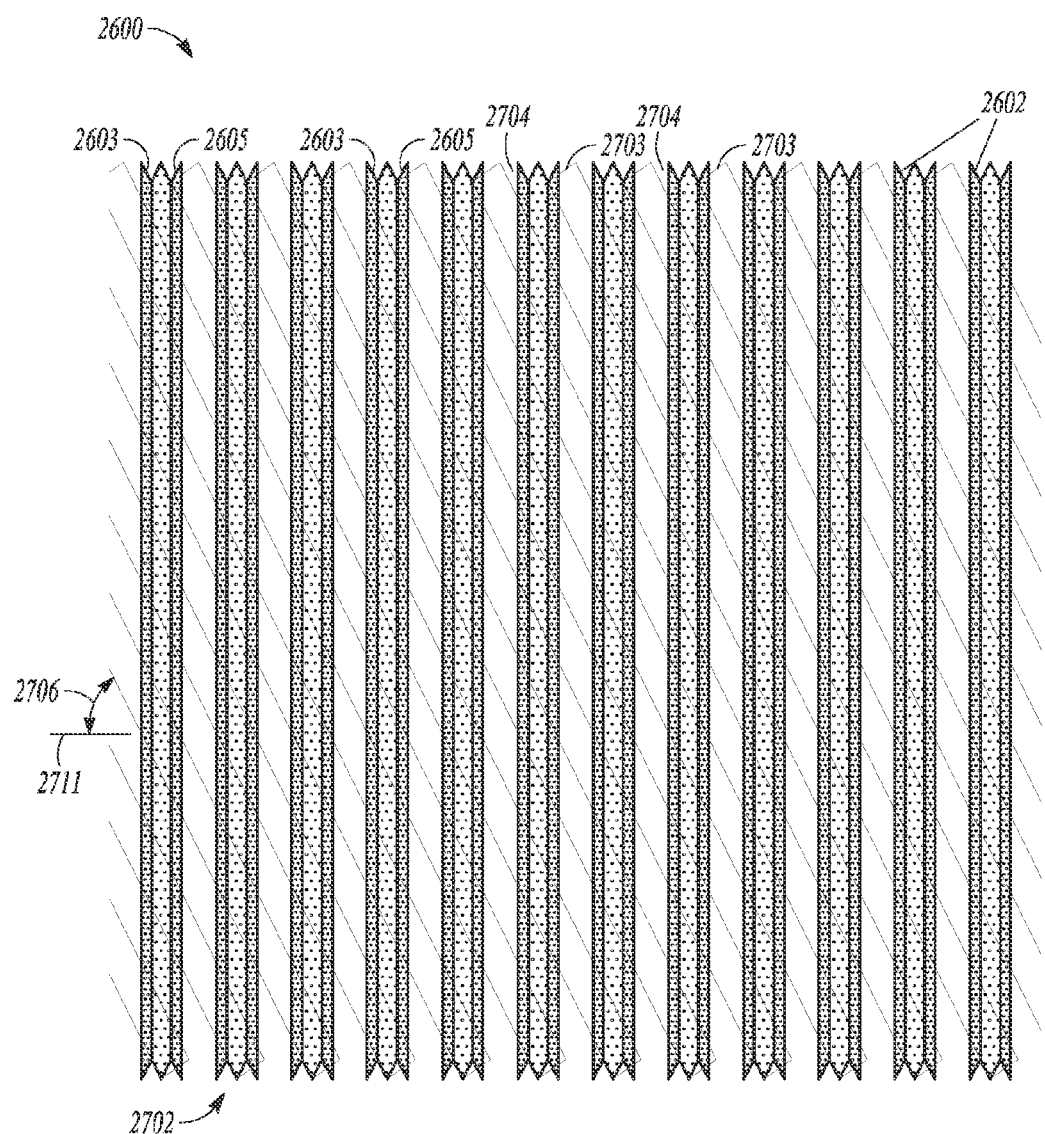

FIG. 28 shows a top view of memory device 2600 with mask 2702 overlying conductive strips 2602 at angle 2706 such that, in each of segments 2603 and 2605 of each conductive strip 2602, mask portions 2703 and openings 2704 may alternately mask one portion and leave another portion unmasked. Angle 2706 between mask 2702 and line 2711 in FIG. 28 may be calculated based on an equation described with reference to FIG. 35.

Figure 29:
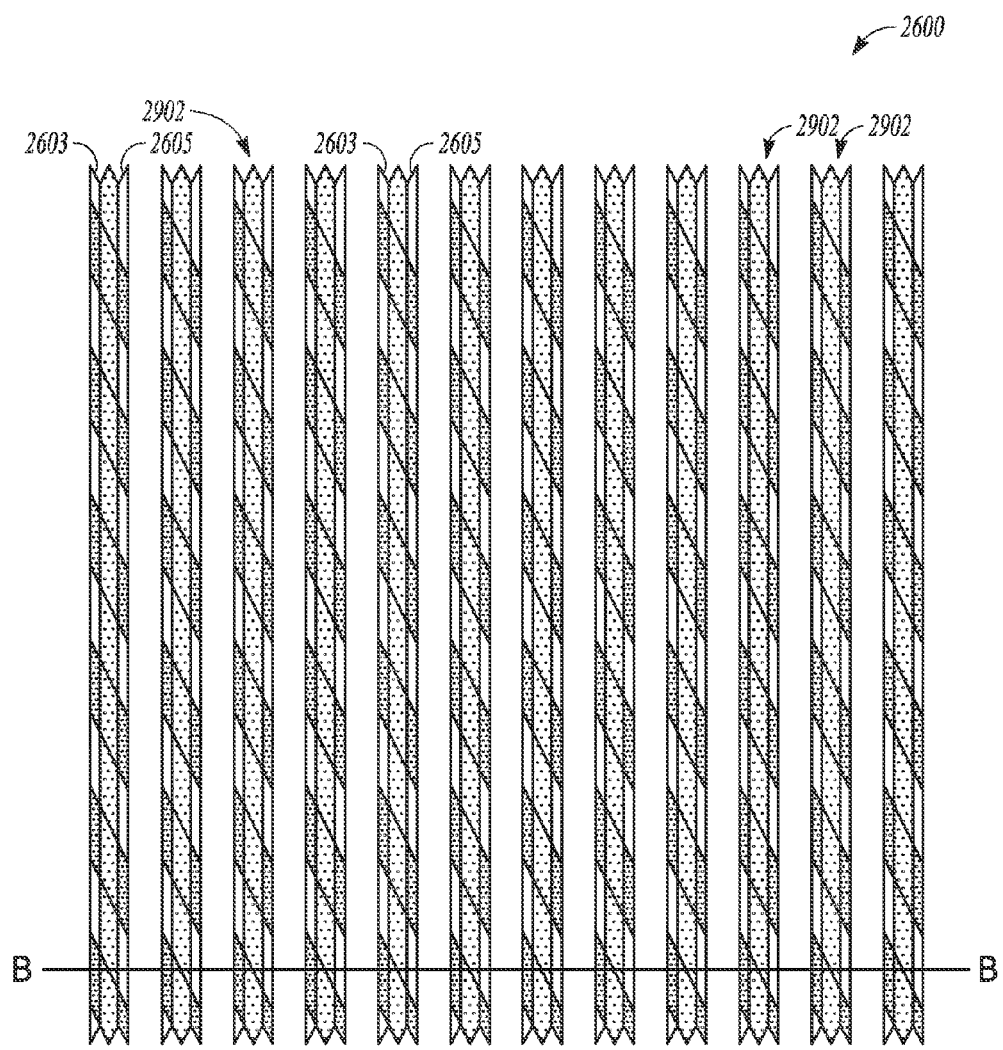

FIG. 29 shows memory device 2600 after remaining conductive strips 2902 may be formed. Each remaining conductive strip 2902 may be formed after the unmasked portion of each of segments 2603 and 2605 (FIG. 28) is removed. As shown in FIG. 29, each remaining conductive strip 2902 may include segment 2603 having portions removed, and segment 2605 having portions removed.

Figure 30:
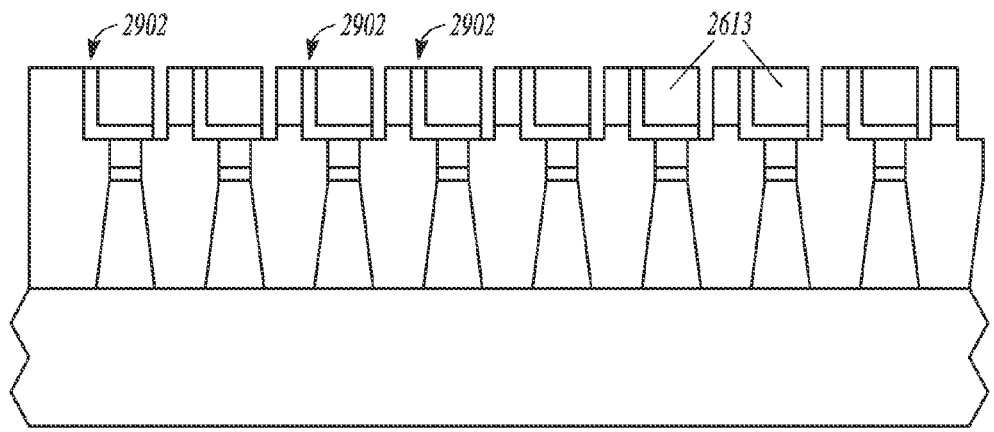

FIG. 30 shows a cross-section of memory device 2600 including remaining conductive strips 2902 and material 2613.

Figure 31:
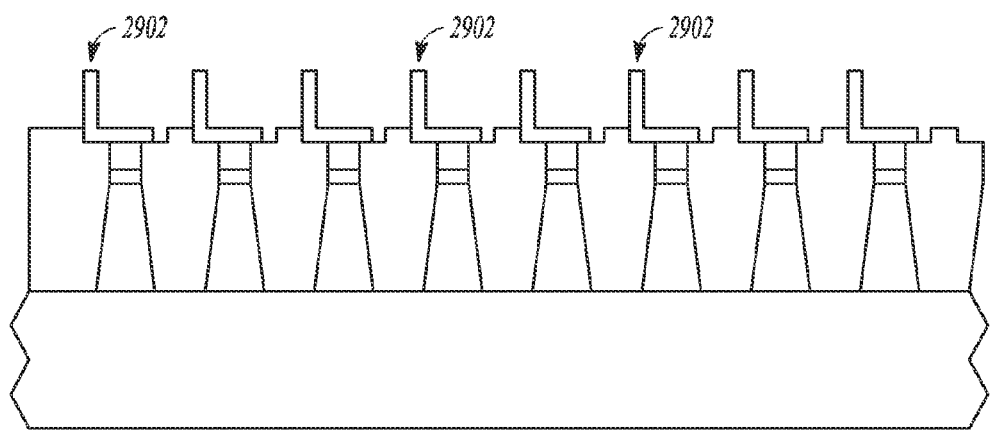

FIG. 31 shows a cross-section of memory device 2600, including remaining conductive strips 2902 after removal of material 2613 (FIG. 29).

Figure 32:
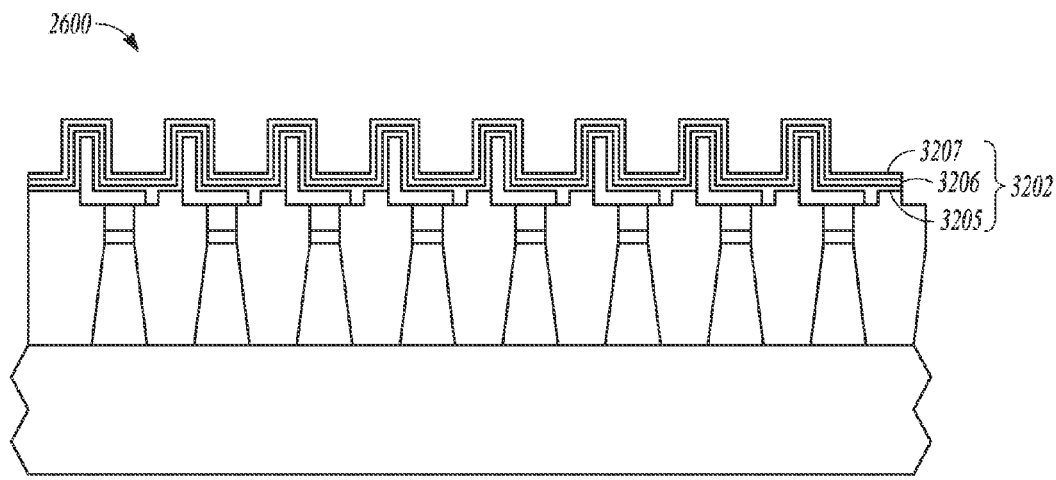

FIG. 32 shows a cross-section of memory device 2600, including memory device 2600 after an insulation layer 3202 may be formed. Insulation layer 3202 may include multiple layers 3205, 3206, and 3207. Each of layers 3205 and 3207 may include an oxide of silicon. Layer 3206 may include silicon nitride.

Figure 33:
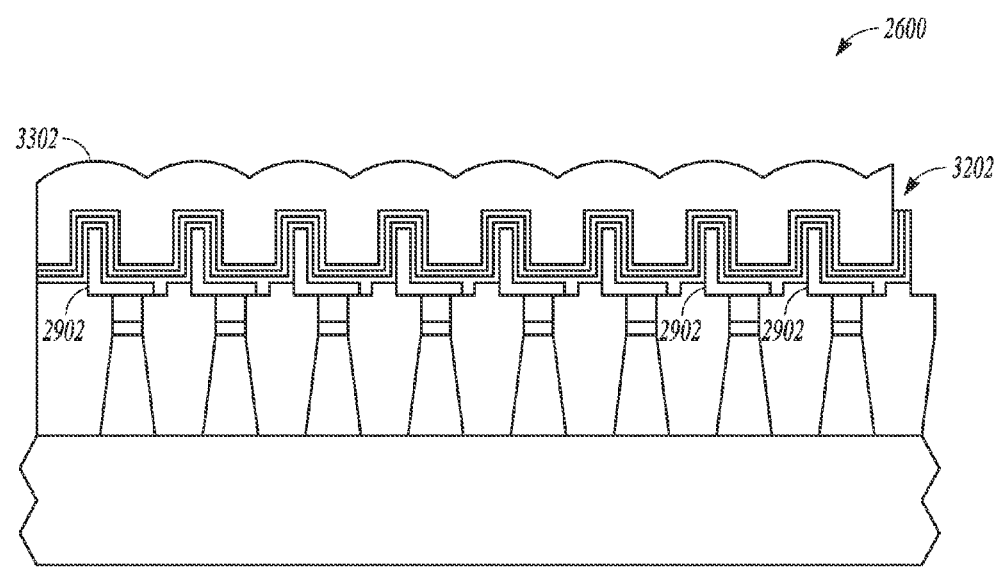

FIG. 33 shows a cross-section of memory device 2600 after a conductive layer 3302 may be formed, overlying insulation layer 3202 and remaining conductive strips 2902. Conductive layer 3302 may include polysilicon or other conductive material.

Figure 34:
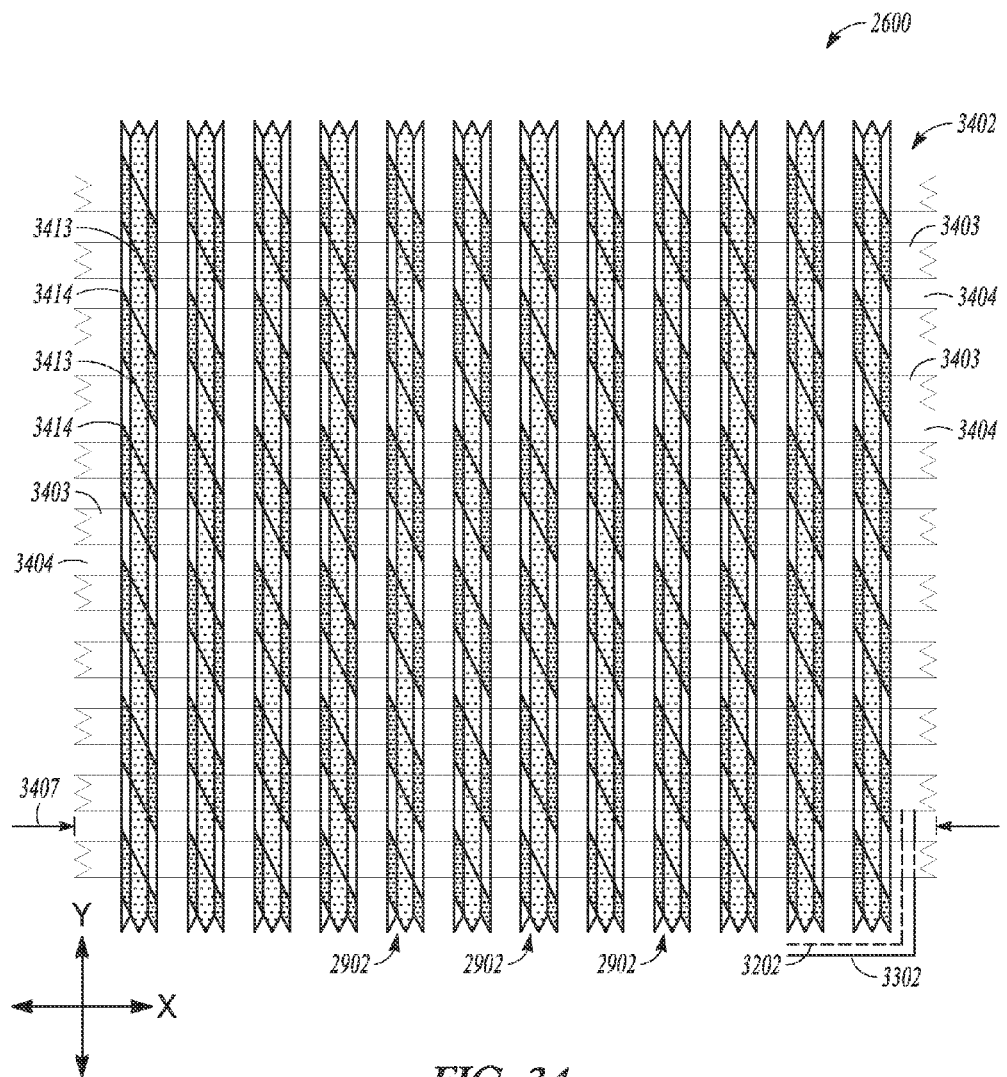

FIG. 34 shows a top view of memory device 2600 after a mask 3402 may be applied. For clarity, in FIG. 34, conductive layer 3302 and insulation layer 3202 are partially shown. Mask 3402 may overlie conductive layer 3302, insulation layer 3202, and remaining conductive strips 2902. Mask 3402 may include mask portions 3403 and openings 3404. Mask portions 3403 may include photoresist material. Mask portions 3403 may mask portions 3413 of each remaining conductive strip 2902. Each of openings 3404 may have length 3407 in the X-axis dimension. Openings 3404 may expose portions 3414 of each remaining conductive strip 2902. Portions 3414 of remaining conductive strips 2902, portions of conductive layer 3302 in openings 3404, and portions of insulation layer 3202 in openings 3404 may be removed.

Figure 35:
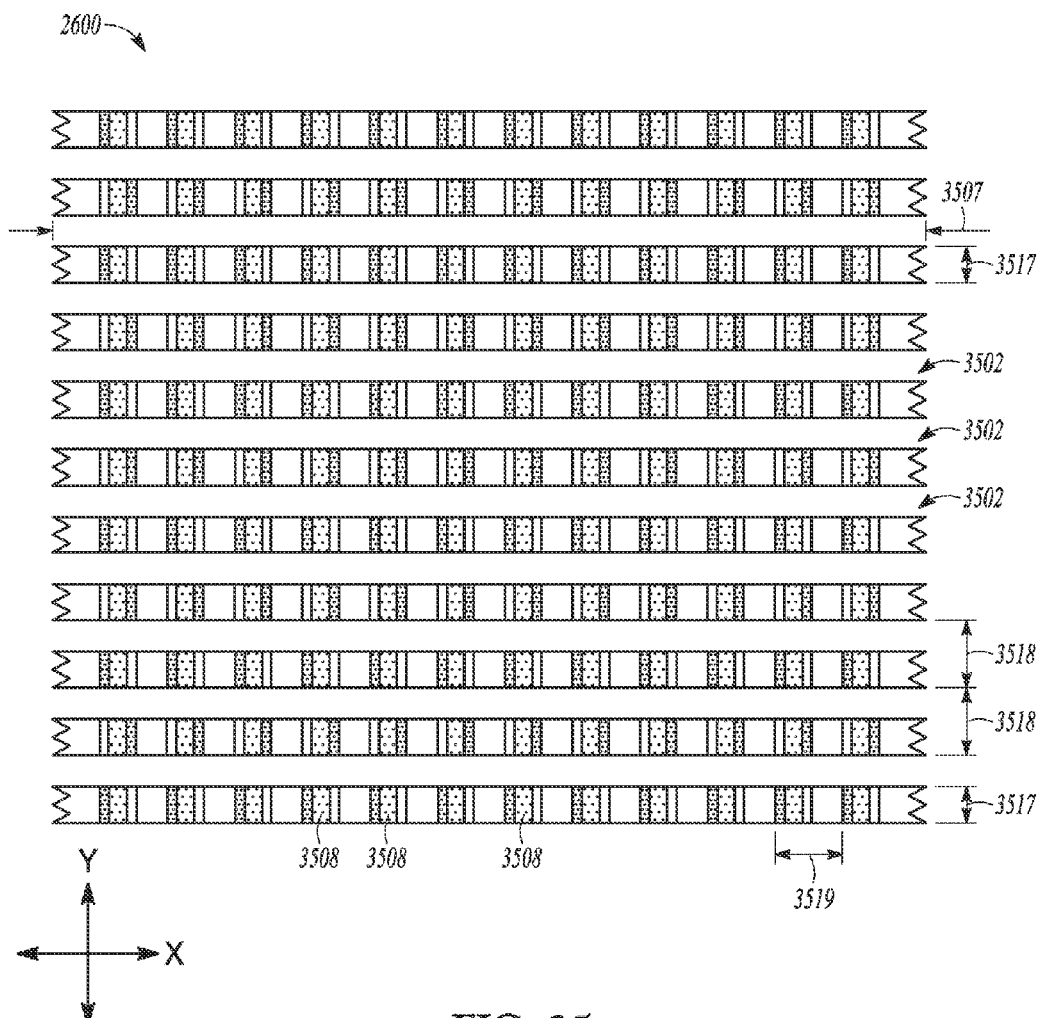
Figure 36:
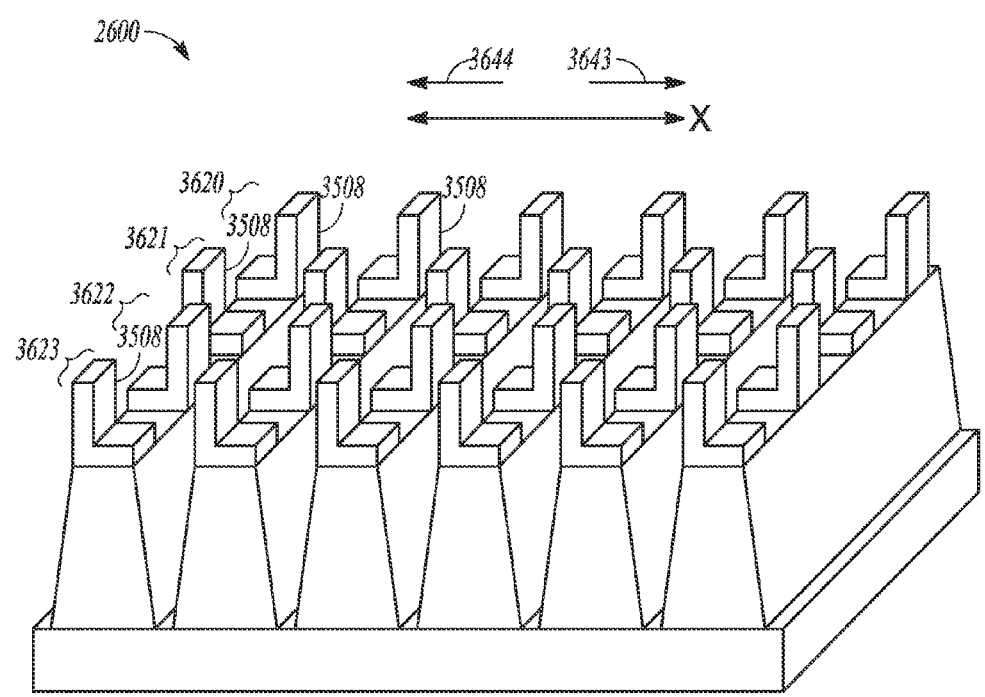

FIG. 35 shows memory device 2600 after removal of portions 3414 of remaining conductive strips 2902 (FIG. 34), portions of conductive layer 3302 in openings 3404, and portions of insulation layer 3202 in openings 3404. As shown in FIG. 35 structures 3502 may be formed. Each structure 3502 may include a row of floating gates 3508. (A 3-D view of floating gates 3508 is shown in FIG. 36.) In FIG. 35, each structure 3502 may have a length 3507 in the X-axis dimension, and a width 3517 in the Y-axis dimension. A distance between two structures 3502 in the Y-axis dimension may be a word line pitch 3518 of memory device 2600. A distance between two floating gates 3508 in the X-axis dimension may be a bit line pitch 3519 of memory device 2600.

FIG. 36 shows a 3-D view of memory device 2600 of FIG. 35 with floating gates 3508. For clarity, FIG. 36 omits some features such as word lines overlying floating gates 3508. Memory device 2600 of FIG. 36 may be similar or identical to memory device 700 of FIG. 7. As shown in FIG. 36, each floating gate 3508 may have an L-shape. Thus, each floating gate 3508 may be called an L-shaped floating gate. FIG. 36 shows two directions 3633 and 3644 in the X-axis dimension, and structures 3502 (FIG. 35) may be arranged in rows 3620, 3621, 3622, and 3623 in the X-axis dimension. As shown in FIG. 36, L-shaped floating gates 3508 in the same row may face the same direction, either a direction 3633 or direction 3644. However, L-shaped floating gates 3508 in two rows that are immediately next to each other may face different directions. For example, L-shaped floating gates 3508 in row 3620 may face direction 3644 whereas floating gates 3508 in row 3621 may face direction 3633. Similarly floating gates 3508 in row 3622 may face direction 3644 whereas floating gates 3508 in row 3623 may face direction 3633. With the arrangement shown in FIG. 36, floating gates 3508 may be called mirrored L-shaped floating gates.

Figure 37:
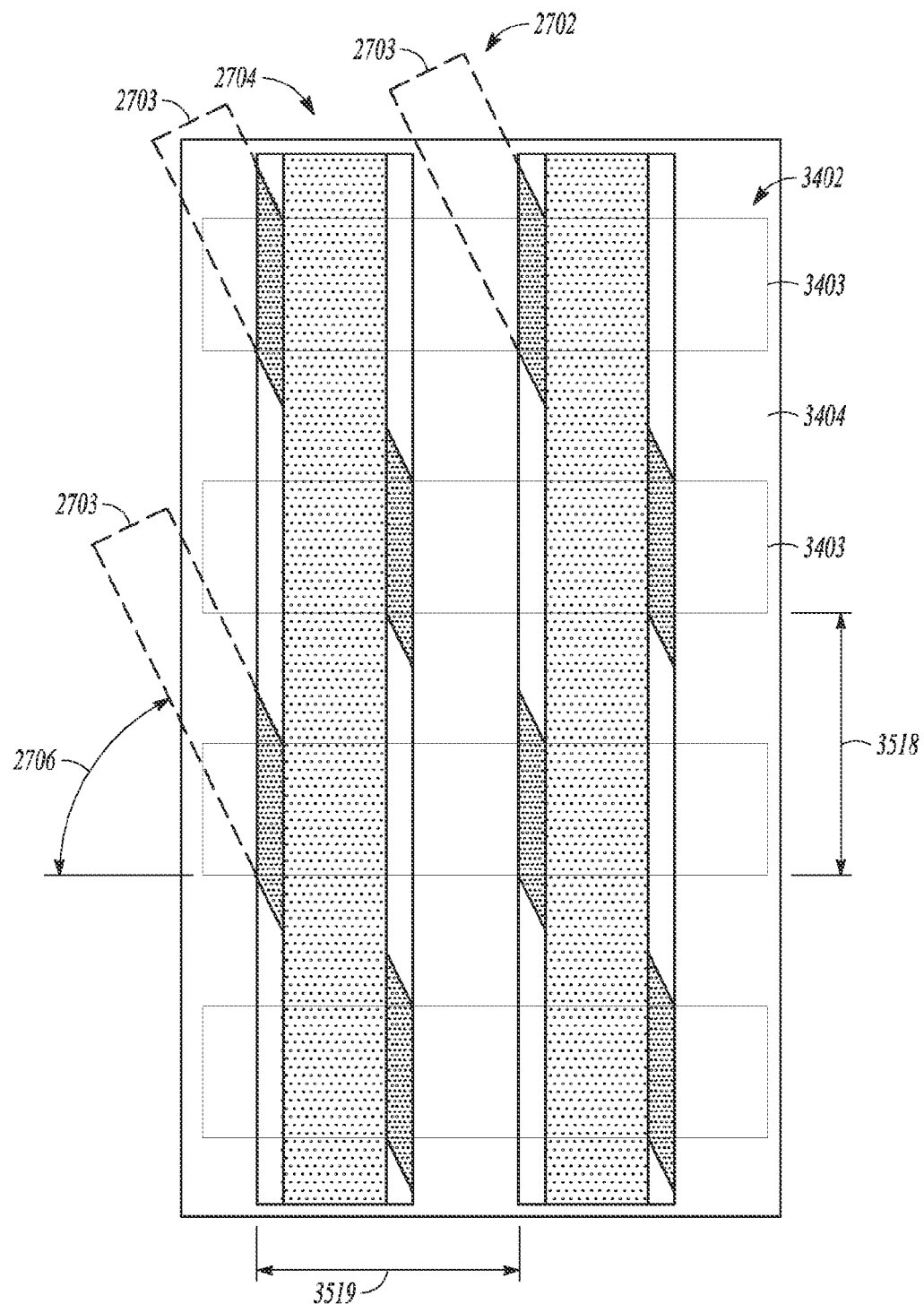

FIG. 37 shows example dimensions for a calculation of the value of angle 2706 (FIG. 27 and FIG. 28) for the placement of mask 2802. For purposes of formulating equation 1 below, FIG. 37 repeats features described above such as mask portions 2703 and openings 2704 of mask 2702 of FIG. 27 and FIG. 28, mask 3402 of FIG. 34 with mask portions 3403 and openings 3404, word line pitch 3518 and bit line pitch 3519 of FIG. 35.

Based on FIG. 37, the value of angle 2706 may be calculated from equation 1 below.

$$A = \arctan(2 * Wp/Bp) \qquad (1)$$

In equation 1 above, A represents the value of angle 2706, Wp represents the value of word line pitch 3518, and Bp represents the value of bit line pitch 3519. Thus, when structures 3502 of FIG. 35 are constructed such that Wp=Bp, then A (the value of angle 2706) may be about 63.4°.

From equation 1, the value of angle 2706 may be obtained based on the values of word line pitch 3518 and bit line pitch 3519. Thus, various values of angle 2706 may be obtained when the values of word line pitch 3518 and bit line pitch 3519 are determined.

The description above with reference to FIG. 26 through FIG. 37 shows various activities of a method of forming a memory device according to an embodiment of the invention, such as memory device 2600 with mirrored L-shaped floating gates 3508 shown in FIG. 36.

Figure 38:
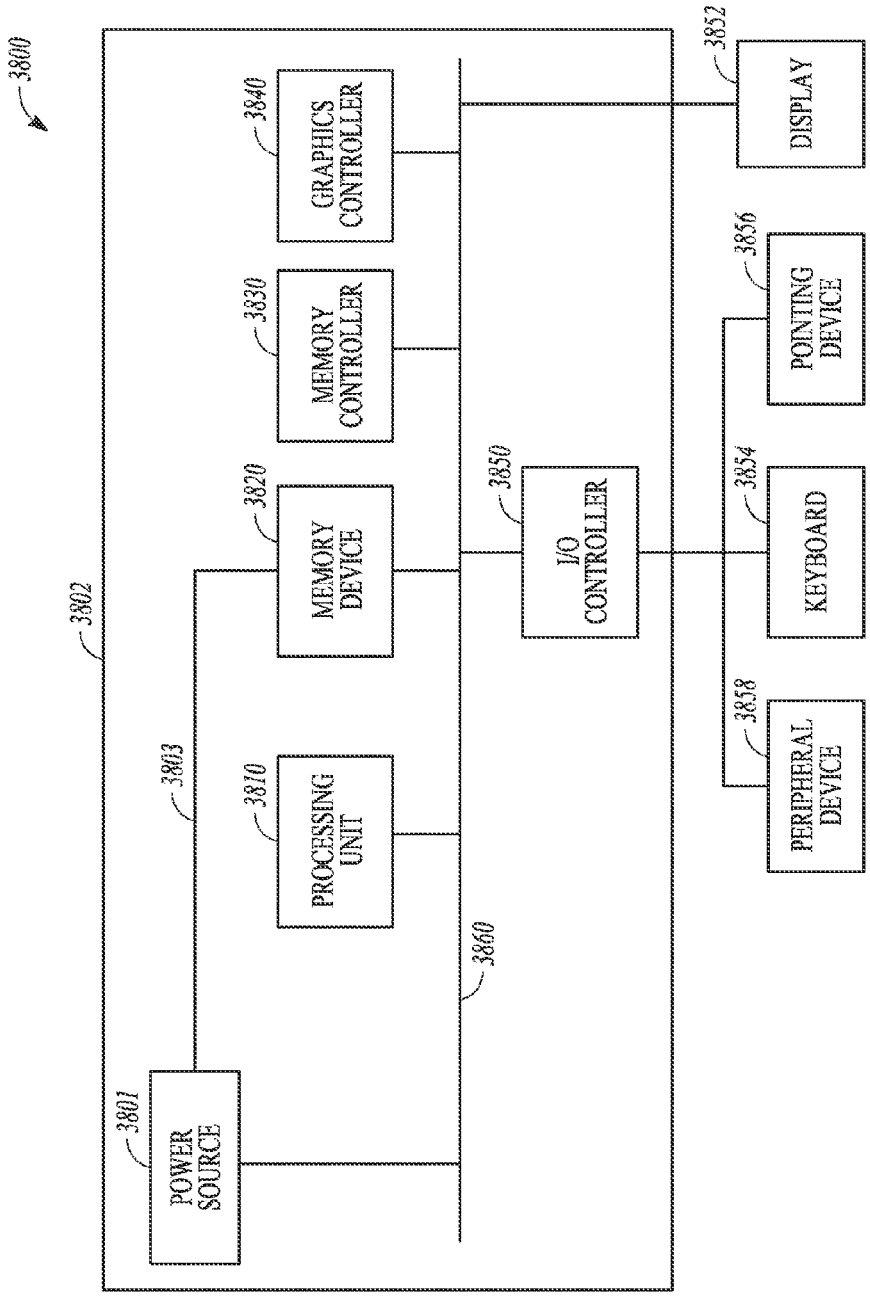
FIG. 38 shows a block diagram of a system according an embodiment of the invention.

FIG. 38 shows a block diagram of a system 3800 according to an embodiment of the invention. System 3800 may include a power source 3801, a processing unit 3810, a memory device 3820, a memory controller 3830, a graphics controller 3840, an input and output (I/O) controller 3850, a display 3852, a keyboard 3854, a pointing device 3856, a peripheral device 3858, and a bus 3860. System 3800 may also include a circuit board 3802 on which some components of system 3800 may be located, as shown in FIG. 38. Circuit board 3802 may include terminals 3803 and 3805 coupled to power source 3801 to provide power or voltage to the components of system 3800. Power source 3801 may be provided by alternating current to direct current (AC to DC) converting circuitry, a battery, or others. Memory device 3820 may be a volatile memory device, a non-volatile memory device, or a combination of both. For example, memory device 3820 may be a dynamic random access memory (DRAM) device, a static random access memory (SRAM) device, a flash memory device, or a combination of these memory devices. I/O controller 3850 may include a communication module for wired or wireless communication. In some embodiments, the number of components of system 3800 may vary.

Processing unit 3810 may process data transferred to and from other components via bus 3860. Processing unit 3810 may include a general-purpose processor or an application specific integrated circuit (ASIC). Processing unit 3810 may be a single core processing unit or a multiple-core processing unit.

In some embodiments, one or more components of system 3800 may include at least one memory cell with an L-shaped floating gate such as floating gate 208, 508, 708, 2408, and 3508 described above with reference to FIG. 2 though FIG. 37.

System 3800 may include computers (e.g., desktops, laptops, hand-held devices, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape players, and compact disc players, DVD players, video cassette recorders, DVD recorders, camcorders, digital cameras, MP3 (Motion Picture Experts Group, Audio Layer 3) players, video games, watches, etc.), and the like.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 38 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. An apparatus comprising:
   a substrate; and
   a first memory cell coupled to the substrate, the first memory cell including a first L-shaped floating gate;
   a control gate;
   an insulation layer coupled between the control gate and the first L-shaped floating gate; and
   a conductive layer coupled between the substrate and the first L-shape floating gate, wherein the first L-shape floating gate includes a first segment substantially parallel to a top surface of the substrate, and a second segment coupled to the first segment and extending away from the substrate, and wherein the conductive layer has a length less than a length of the first segment of the first L-shaped floating gate.

2. The apparatus of claim 1, further comprising a second memory cell coupled to the substrate, the second memory cell including a second L-shaped floating gate.

3. The apparatus of claim 2, wherein the first L-shaped floating gate faces a first direction in an X-axis dimension, and wherein the second L-shaped floating gate faces a second direction in the X-axis dimension.

4. The apparatus of claim 3, further comprising a plurality of third memory cells coupled to the substrate and a plurality of fourth memory cells coupled to the substrate, wherein the plurality of third memory cells is arranged with the first memory cell in a first row, wherein the plurality of fourth memory cells is arranged with the second memory cell in a second row, wherein each of the third memory cells includes a third L-shaped floating gate, and wherein each of the fourth memory cells includes a fourth L-shaped floating gate.

5. The apparatus of claim 4, further comprising:
   a first word line shared by the first memory cell and the plurality of third memory cells; and
   a second word line shared by the second memory cell and the plurality of fourth memory cells.

6. The apparatus of claim 1, further comprising:
   a plurality of second memory cells coupled to the substrate, each of the second memory cells including a second L-shaped floating gate; and
   a word line shared by the first memory cell and the plurality of second memory cells.

7. The apparatus of claim 6, wherein the word line includes a word line portion between two second L-shaped floating gates, and wherein a value of a thickness of the word line portion is at least equal to 58 percent of a value of a bit line pitch between the two second L-shaped floating gates.

8. The apparatus of claim 6, wherein the word line includes a word line portion between two second L-shaped floating gates, and wherein a value of a thickness of the word line portion is at least equal to 40 percent of a value of a bit line pitch between the two second L-shaped floating gates.

9. The apparatus of claim 6, wherein the word line includes a word line portion between two second L-shaped floating gates, and wherein a value of a thickness of the word line portion is at least equal to 19 percent of a value of a bit line pitch between the two second L-shaped floating gates.

10. A system comprising:
    a flash memory device including,
    a substrate; and
       a first memory cell coupled to the substrate, the first memory cell including a first L-shaped floating gate;
    a control gate;
       an insulation layer coupled between the control gate and the first L-shaped floating gate; and
    a conductive layer coupled between the substrate and the first L-shape floating gate, wherein the first L-shape floating gate includes a first segment substantially parallel to a top surface of the substrate, and a second segment coupled to the first segment and extending away from the substrate, and wherein the conductive layer has a length less than a length of the first segment of the first floating gate; and
    a circuit board coupled to the flash memory device, the circuit board including a terminal to couple to a battery to provide power to the flash memory device.

11. The system of claim 10, further comprising a second memory cell coupled to the substrate, the second memory cell including a second L-shaped floating gate.

12. The system of claim 11, wherein the first L-shaped floating gate faces a first direction in an X-axis dimension, and wherein the second L-shaped floating gate faces a second direction in the X-axis dimension.

* * * * *